(12) United States Patent
Cha et al.

(10) Patent No.: US 10,204,962 B2
(45) Date of Patent: Feb. 12, 2019

(54) LIGHT SOURCE MODULE AND DISPLAY APPARATUS HAVING THE SAME

(71) Applicant: Samsung Electronics Co., Ltd., Suwon-si, Gyeonggi-do (KR)

(72) Inventors: Nam Goo Cha, Hwaseong-si (KR); Ki Seok Kim, Hwaseong-si (KR); Yun Hee Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/218,483

(22) Filed: Jul. 25, 2016

(65) Prior Publication Data

US 2017/0141154 A1     May 18, 2017

(30) Foreign Application Priority Data

Nov. 16, 2015     (KR) .................. 10-2015-0160588

(51) Int. Cl.
    *G09F 9/33*     (2006.01)
    *H01L 27/15*     (2006.01)
    (Continued)

(52) U.S. Cl.
    CPC .............. *H01L 27/156* (2013.01); *F21V 9/14* (2013.01); *G02B 6/001* (2013.01); *G02B 6/0006* (2013.01);
    (Continued)

(58) Field of Classification Search
    CPC ....... F21V 9/14; G02B 6/0096; H01L 27/156; H01L 33/50; H01L 33/62; H05B 33/0854
    See application file for complete search history.

(56) References Cited

U.S. PATENT DOCUMENTS 4,271,408 A *   6/1981   Teshima ................. G08G 1/095
                                                                                                                          340/815.45
4,708,381 A      11/1987   Lundback
                   (Continued)

FOREIGN PATENT DOCUMENTS

CN        201100902 Y     8/2008
CN        104271397 A     1/2015
              (Continued)

OTHER PUBLICATIONS

Chinese Office Action dated Jul. 24, 2018 issued in Chinese Application No. 201611042185.8 (English translation provided).

*Primary Examiner* — Alexander H Taningco
*Assistant Examiner* — Kurtis R Bahr
(74) *Attorney, Agent, or Firm* — Harness, Dickey & Pierce, P.L.C.

(57) ABSTRACT

A display apparatus may include a light source module that may include a substrate having a plurality of chip mounting areas of which each has a connection pad disposed therein, and a plurality of semiconductor light emitting devices electrically coupled to separate connection pads. The display apparatus may include a black matrix on the substrate and having a plurality of holes corresponding to the pattern of chip mounting areas. The semiconductor light emitting devices may be in separate, respective holes to be electrically coupled to separate connection pads. The display apparatus may include unit pixels, where each unit pixel includes multiple adjacent semiconductor light emitting devices. The semiconductor light emitting devices may be removably coupled to separate connection pads, and a semiconductor light emitting device may be interchangeably swapped from a connection pad.

20 Claims, 19 Drawing Sheets

(51) Int. Cl.
*F21V 9/14* (2006.01)
*F21V 8/00* (2006.01)
*H01L 33/50* (2010.01)
*H01L 33/62* (2010.01)
*H05B 33/08* (2006.01)
*G09F 13/00* (2006.01)
*H01L 25/075* (2006.01)

(52) U.S. Cl.
CPC ......... *G02B 6/0008* (2013.01); *G02B 6/0096* (2013.01); *G09F 9/33* (2013.01); *G09F 13/00* (2013.01); *H01L 33/50* (2013.01); *H01L 33/62* (2013.01); *H05B 33/0854* (2013.01); *G02B 6/0003* (2013.01); *G02B 6/0016* (2013.01); *G02B 6/0073* (2013.01); *G02B 6/0078* (2013.01); *H01L 25/0753* (2013.01)

(56) References Cited

U.S. PATENT DOCUMENTS

| | | | |
|---|---|---|---|
| 4,847,991 A | 7/1989 | Higuchi | |
| 5,193,269 A | 3/1993 | Dattilo | |
| 5,656,847 A * | 8/1997 | Okazaki | H01L 33/44 257/100 |
| 6,372,608 B1 | 4/2002 | Shimoda et al. | |
| 6,448,900 B1 * | 9/2002 | Chen | G09F 9/33 340/815.45 |
| 6,543,668 B1 | 4/2003 | Fujii et al. | |
| 6,645,830 B2 | 11/2003 | Shimoda et al. | |
| RE38,466 E | 3/2004 | Inoue et al. | |
| 6,791,636 B2 * | 9/2004 | Paolini | G02B 6/0038 349/112 |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,360,935 B2 * | 4/2008 | Jensen | F21S 6/001 362/392 |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,972,032 B2 * | 7/2011 | Meersman | F21K 9/00 362/237 |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,033,704 B2 * | 10/2011 | Krupa | G02B 6/0006 362/551 |
| 8,049,161 B2 | 11/2011 | Sherrer et al. | |
| 8,079,743 B2 * | 12/2011 | Bailey | G02B 6/0021 362/555 |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,333,860 B1 | 12/2012 | Bibl et al. | |
| 8,349,116 B1 | 1/2013 | Bibl et al. | |
| 8,383,506 B1 | 2/2013 | Golda et al. | |
| 8,399,944 B2 | 3/2013 | Kwak et al. | |
| 8,415,767 B1 | 4/2013 | Golda et al. | |
| 8,415,768 B1 | 4/2013 | Golda et al. | |
| 8,415,771 B1 | 4/2013 | Golda et al. | |
| 8,426,227 B1 | 4/2013 | Bibl et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,569,115 B1 | 10/2013 | Golda et al. | |
| 8,735,931 B2 | 5/2014 | Han et al. | |
| 8,766,295 B2 | 7/2014 | Kim | |
| 9,070,827 B2 * | 6/2015 | Peng | H01L 33/0066 |
| 2009/0185392 A1 * | 7/2009 | Krupa | A61B 1/0653 362/553 |
| 2012/0324771 A1 * | 12/2012 | Safavi | G09F 9/33 40/452 |
| 2013/0126081 A1 | 5/2013 | Hu et al. | |
| 2013/0126098 A1 | 5/2013 | Bibl et al. | |
| 2013/0126589 A1 | 5/2013 | Bibl et al. | |
| 2013/0126827 A1 | 5/2013 | Bibl et al. | |
| 2013/0126891 A1 | 5/2013 | Bibl et al. | |
| 2013/0127020 A1 | 5/2013 | Bibl et al. | |
| 2013/0128585 A1 | 5/2013 | Bibl et al. | |
| 2013/0130440 A1 | 5/2013 | Hu et al. | |
| 2013/0300812 A1 | 11/2013 | Bibl et al. | |
| 2013/0316529 A1 | 11/2013 | Golda et al. | |
| 2014/0008813 A1 | 1/2014 | Golda et al. | |
| 2014/0048909 A1 | 2/2014 | Golda et al. | |
| 2014/0064904 A1 | 3/2014 | Bibl et al. | |
| 2014/0169924 A1 | 6/2014 | Golda et al. | |
| 2014/0196851 A1 | 7/2014 | Golda et al. | |
| 2014/0209248 A1 | 7/2014 | Golda et al. | |
| 2014/0241844 A1 | 8/2014 | Golda et al. | |
| 2014/0299572 A1 | 10/2014 | Bibl et al. | |
| 2014/0367705 A1 | 12/2014 | Bibl et al. | |
| 2015/0146433 A1 * | 5/2015 | Suzuki | B60Q 3/80 362/311.01 |
| 2015/0369442 A1 * | 12/2015 | Fukui | G02B 6/0006 362/511 |

FOREIGN PATENT DOCUMENTS

| | | |
|---|---|---|
| JP | 7-066592 | 3/1995 |
| JP | 11-330793 | 11/1999 |
| JP | 2006-108198 A | 4/2006 |
| JP | 5303487 B2 | 10/2013 |
| KR | 10-1385444 B1 | 4/2014 |

* cited by examiner

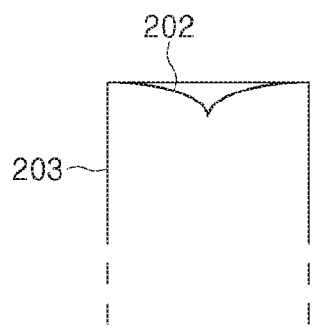 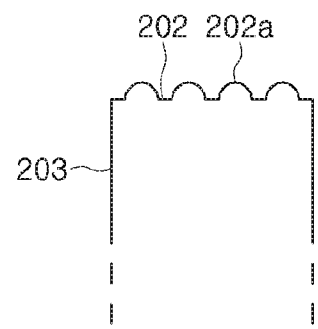 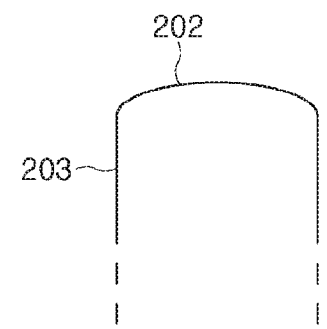
FIG. 8A  FIG. 8B  FIG. 8C
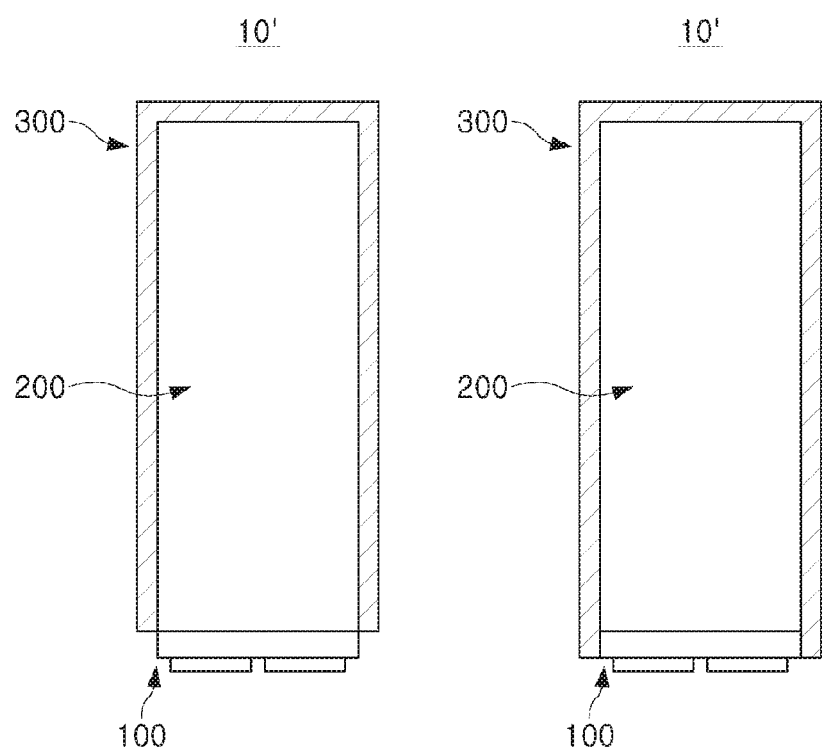
FIG. 9A  FIG. 9B

LIGHT SOURCE MODULE AND DISPLAY APPARATUS HAVING THE SAME

CROSS-REFERENCE TO RELATED APPLICATION

This application claims benefit of priority of Korean Patent Application No. 10-2015-0160588 filed on Nov. 16, 2015 in the Korean Intellectual Property Office, the disclosure of which is incorporated herein by reference in its entirety.

BACKGROUND

The present inventive concepts relate to light source modules and display apparatuses having the same.

Semiconductor light emitting diode (LED) devices have been widely used. In addition to being used as light sources for lighting apparatuses, semiconductor LED devices may be used also as one or more light sources of various types of electronic products. For example, LED devices have been widely used in display apparatuses used in a range of electronic products such as TVs, cellular phones, PCs, laptop computers, PDAs, and the like.

Display apparatuses may include a display panel, such as a liquid crystal display (LCD), and a backlight unit. Some display apparatuses have been developed to not require a separate backlight unit by using a single LED device as a single pixel. Such display apparatuses may be compact, may have greater luminous efficiency than LCDs, and may be implemented as highly bright displays. In addition, an aspect ratio of a display screen may be freely changed. Display screens including in some display apparatuses may have a large area, such that the display apparatuses may be used in various types of electronic products requiring large displays.

When an LED display panel is manufactured, an LED chip may be aligned in a matrix (a circuit board). In some cases, it may be difficult to precisely align such an LED chip. For example, as LED chips have been miniaturized to become micro LED chips, there is a problem in that failures have occurred or a transfer process time has increased due to such an alignment.

SUMMARY

An aspect of the present inventive concepts may provide a scheme of precisely and quickly moving a small sized chip through a vacuum chuck.

According to an aspect of the present inventive concepts, a light source module may include: a substrate including a plurality of chip mounting areas, each chip mounting area including a connection pad; a black matrix on the substrate, the black matrix including a plurality of holes, the plurality of holes being in a pattern of holes, the pattern of holes corresponding to a pattern of the chip mounting areas on the substrate; and a plurality of semiconductor light emitting devices in separate, respective holes of the plurality of holes, such that the semiconductor light emitting devices are electrically coupled to separate connection pads of separate, respective chip mounting areas corresponding to the separate, respective holes.

According to an aspect of the present inventive concepts, a display apparatus may include: a light source module including a substrate, a black matrix covering the substrate and having a plurality of holes, and a plurality of semiconductor light emitting devices detachably located in separate, respective holes of the plurality of holes; a cover layer covering the black matrix and the plurality of semiconductor light emitting devices; and a housing at least partially enclosing the light source module.

According to an aspect of the present inventive concepts, a controller device may include a memory storing computer-readable instructions and a processor. The processor may be configured to execute the computer-readable instructions to form a black matrix on a substrate, the black matrix including a plurality of holes, the plurality of holes being in a pattern of holes, the pattern of holes corresponding to a pattern of connection pads on the substrate; and insert a plurality of semiconductor light emitting devices in separate, respective holes of the plurality of holes, such that the semiconductor light emitting devices are electrically coupled to separate connection pads corresponding to the separate, respective holes.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 8A, FIG. 8B, and FIG. 8C are side views schematically illustrating various modifications of the shape of a light guide unit in the semiconductor light emitting device illustrated in FIG. 6;

FIG. 9A and FIG. 9B are side views schematically illustrating a semiconductor light emitting device according to at least one example embodiment;

DETAILED DESCRIPTION

Figure 1:
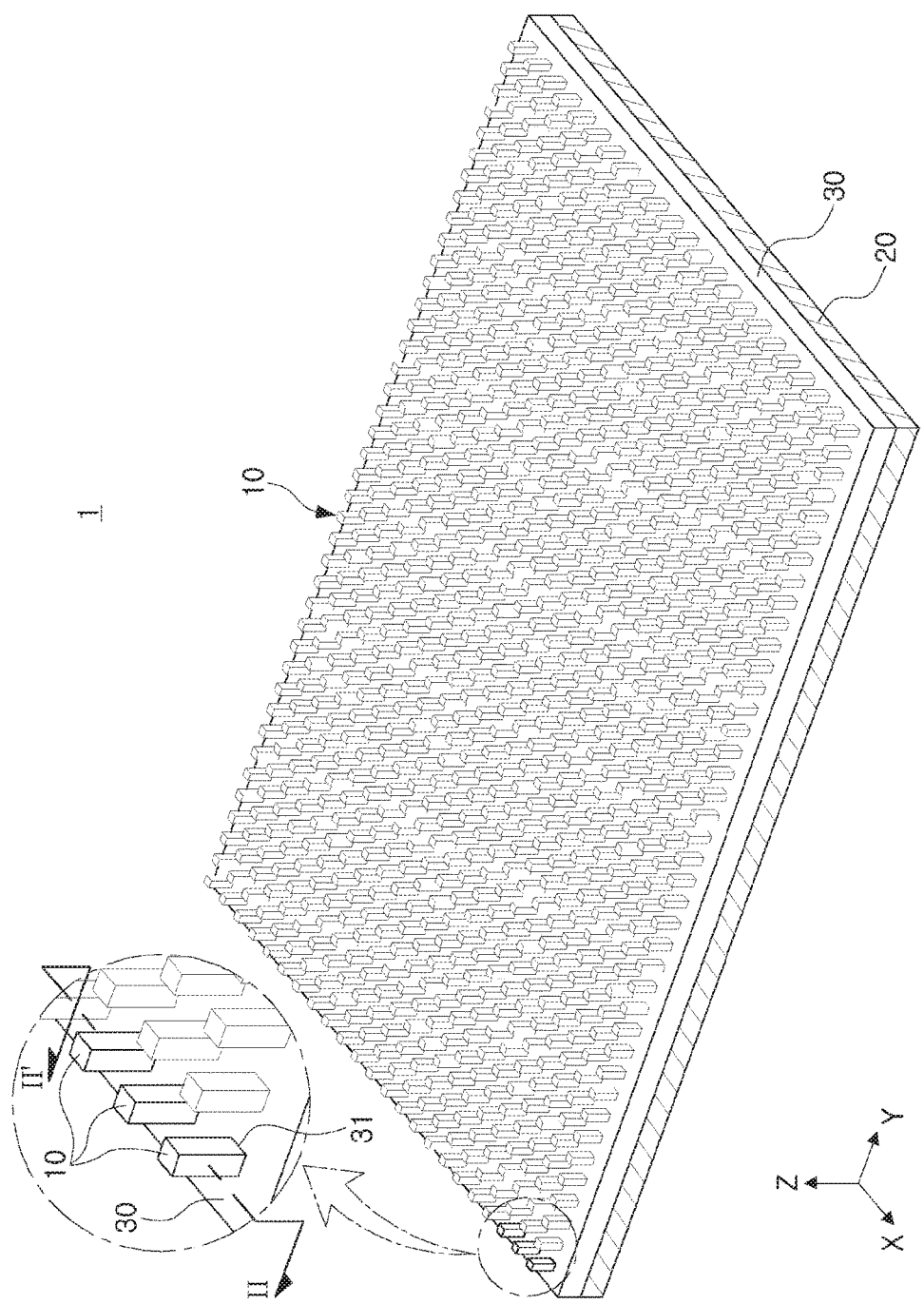
FIG. 1 is a perspective view schematically illustrating a light source module according to at least one example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
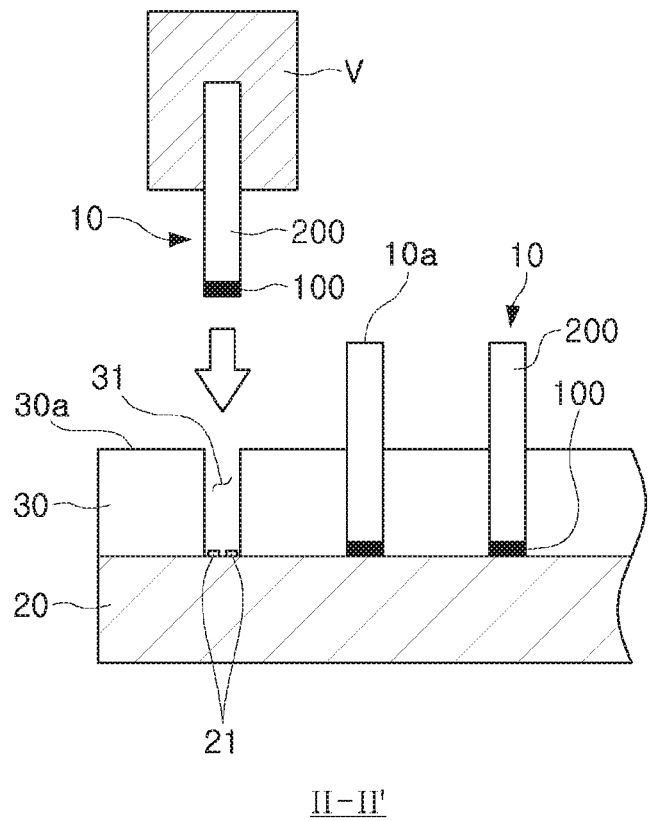
FIG. 2 is a cross-sectional view of a light source module taken along line II-II' of FIG. 1.
Figure 3:
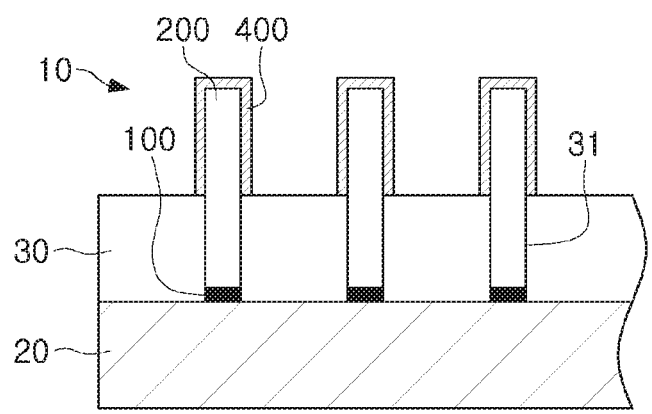
FIG. 3 is a cross-sectional view schematically illustrating a modification of the shape of the light source module of FIG. 2.

FIG. 1 is a perspective view schematically illustrating a light source module according to at least one example embodiment. FIG. 2 is a cross-sectional view of a light source module taken along line II-II' of FIG. 1. FIG. 3 is a cross-sectional view schematically illustrating a modification of the shape of the light source module of FIG. 2.

With reference to FIGS. 1, 2, and 3, a light source module according to at least one example embodiment of the present inventive concepts is described.

With reference to FIGS. 1, 2, and 3, a light source module 1 according to at least one example embodiment of the present inventive concepts may include a substrate 20, a black matrix 30 on the substrate 20 and having a plurality of holes 31, and a plurality of semiconductor light emitting devices 10 in the plurality of holes 31.

The substrate 20 may be a printed circuit board. For example, the substrate 20 may be a FR4-type printed circuit board (PCB) or an easily deformable flexible printed circuit board. The printed circuit board may be formed using an organic resin material including epoxy, triazine, silicon, polyimide, or the like and other organic resin materials, or a ceramic material such as silicon nitride, AlN, $Al_2O_3$, or the like, or metal or a metal compound such as a material of a metal-core printed circuit board (MCPCB), metal copper clad laminate (MCCL), or the like.

The substrate 20 includes a plurality of chip mounting areas, and connection pads 21 may be disposed in the chip mounting areas, respectively. The connection pads 21 may be electrically connected to the plurality of semiconductor light emitting devices 10.

The substrate 20 may be connected to external power (e.g., one or more power supply sources) to drive the plurality of semiconductor light emitting devices 10. The connection pad 21 is provided for applying power to the plurality of semiconductor light emitting devices 10, and may be formed in a conductive thin film form, for example, formed of a material containing a copper foil.

The substrate 20 may have a plate structure in a substantially quadrangular shape by way of example, to illustrate a structure of the substrate 20 according to at least one example embodiment, but is not limited thereto. The substrate 20 may have various structures depending on a structure of a product to be mounted thereon, and, for example, may have a circular structure.

The black matrix 30 may be disposed on the substrate 20 to cover or substantially cover the substrate 20, and the plurality of holes 31 may be provided so as not to cover a chip mounting area of the substrate 20 including the connection pad 21. In other words, the black matrix 30 has the plurality of holes 31 in positions thereof corresponding to the chip mounting areas of the substrate 20, and thus, the chip mounting areas may be areas not covered with the black matrix 30 due to the holes 31.

The plurality of holes 31 may have a structure passing (e.g., "extending") through the black matrix 30.

The plurality of holes 31 may be arranged on the substrate according to an arrangement pattern. Such an arrangement of hole 31 may be referred to as an arrangement of holes 31 on the substrate. The arrangement of holes 31 may include a plurality of columns of rows. The columns may extend in a transverse direction and a longitudinal direction. For example, the arrangement of holes 31 may include at least one of a checkerboard pattern and a matrix pattern.

A black matrix 30 that includes the plurality of holes 31 may be formed using a method of forming a pattern by depositing pigment on a surface of the substrate 20 and etching the deposited pigment. The black matrix 30 is not limited to being black in color, and a matrix of other colors, including a white matrix, a green matrix, some combination thereof, or the like may be used according to a use and a place of use, or the like, of a product that includes the light source module 1. Moreover, a matrix of a transparent material may be used as needed. The white matrix may further include a light reflective material or a light scattering material.

A lateral surface of the black matrix 30 may be substantially coplanar with a lateral surface of the substrate 20.

The plurality of semiconductor light emitting devices 10 may respectively be detachably disposed in the plurality of holes 31. For example, the plurality of semiconductor light emitting devices 10 may be clamped by a vacuum chuck V respectively to be inserted into the plurality of holes 31 in a pick-and-place method respectively and then disposed therein. In at least one example embodiment, the semiconductor light emitting device 10 may be electrically connected to the connection pad 21 exposed externally through the hole 31 in a state in which the semiconductor light emitting device 10 is not disposed therein.

The semiconductor light emitting device 10 may include an LED chip 100 and a light guide unit 200. A detailed structure of the semiconductor light emitting device 10 will be described later.

The plurality of semiconductor light emitting devices 10 disposed in the black matrix 30 may protrude from the black matrix 30. In other words, a top surface 30a of the black matrix 30 may be lower than top surfaces 10a of the plurality of semiconductor light emitting devices 10, and thus, the plurality of semiconductor light emitting devices 10 may be fixedly disposed in the holes 31, respectively, while protruding upwardly from the black matrix 30. In at least one example embodiment, in a state in which the plurality of semiconductor light emitting devices 10 are disposed in the holes 31, respectively, portions of the semiconductor light emitting devices 10 may protrude upwardly from the black matrix 30. In detail, the respective light guide units 200 of the semiconductor light emitting devices 10 may partially protrude upwardly from the black matrix 30.

A projection height of the semiconductor light emitting device 10 (e.g., a height of the top surface 10a) may be variously adjusted according to a height of the top surface 30a of the black matrix 30.

Figure 4:
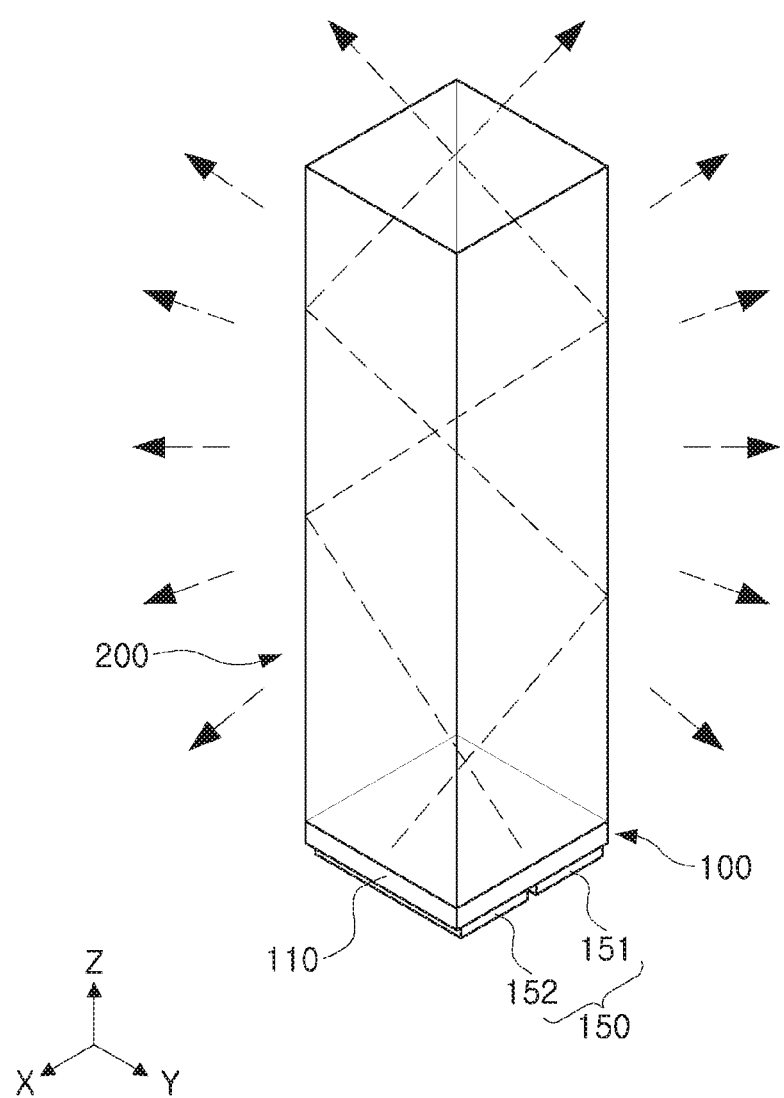
FIG. 4 is a perspective view schematically illustrating a semiconductor light emitting device according to at least one example embodiment.
Figure 5:
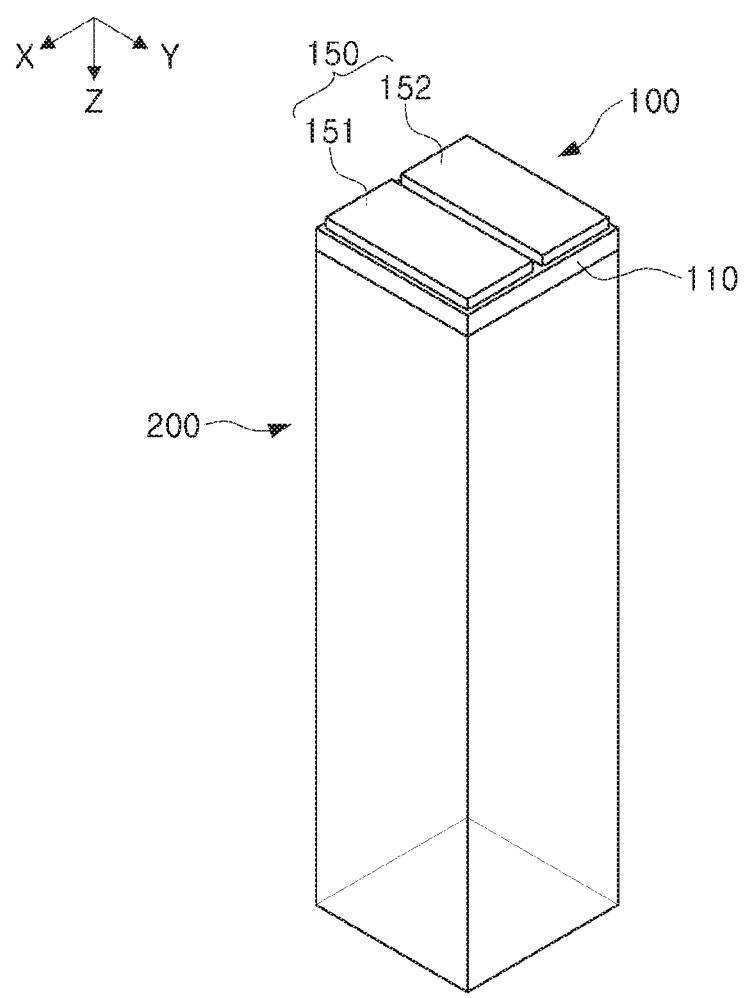
FIG. 5 is a perspective view schematically illustrating the semiconductor light emitting device of FIG. 4 in an inverted state.
Figure 6:
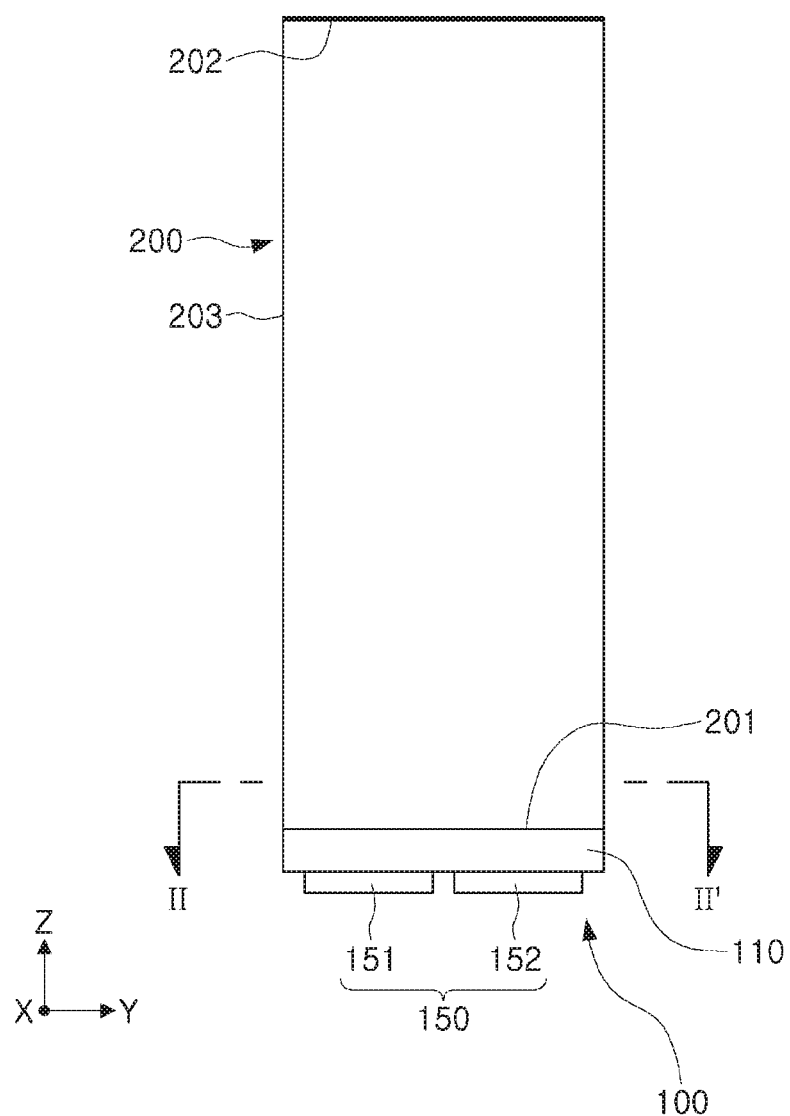
FIG. 6 is a side view of FIG. 4.

FIG. 4 is a perspective view schematically illustrating a semiconductor light emitting device according to at least one example embodiment. FIG. 5 is a perspective view schematically illustrating the semiconductor light emitting device of FIG. 4 in an inverted state. FIG. 6 is a side view of FIG. 4;

With reference to FIG. 4, FIG. 5, and FIG. 6, a semiconductor light emitting device according to at least one example embodiment of the present inventive concepts is described.

With reference to FIG. 4 to FIG. 6, a semiconductor light emitting device 10 according to at least one example embodiment of the present inventive concepts may include an LED chip 100 and a light guide unit 200.

The LED chip 100 may be an optoelectronic device generating light having a desired (and/or alternatively predetermined) wavelength by driving power applied externally. For example, the LED chip 100 may include a semiconductor light emitting diode (LED) chip having a first conductivity type semiconductor layer, a second conductivity type semiconductor layer, and an active layer interposed therebetween.

The LED chip 100 may emit blue light, green light, or red light according to a combination of a material or a phosphor contained therein, therewith, and may also emit white light, ultraviolet light, or the like.

In the case of the LED chips 100, the same type of LED chips generating light having the same wavelength or different types of LED chips generating light having different wavelengths may be variously provided. In addition, the LED chip 100 may be variously configured depending on the use of power levels such as 0.5 W and 1 W.

As illustrated in FIG. 5, the LED chip 100 may have a structure having a substantially quadrangular shape when viewed from directly below a lower surface. In addition, an electrode pad 150 may be provided on one surface of the LED chip 100, for example, a lower surface thereof.

A shape of the LED chip 100 viewed from above may be a polygonal shape such as a rectangle, a triangle, a hexagon, and the like, in addition to a square.

Figure 7:
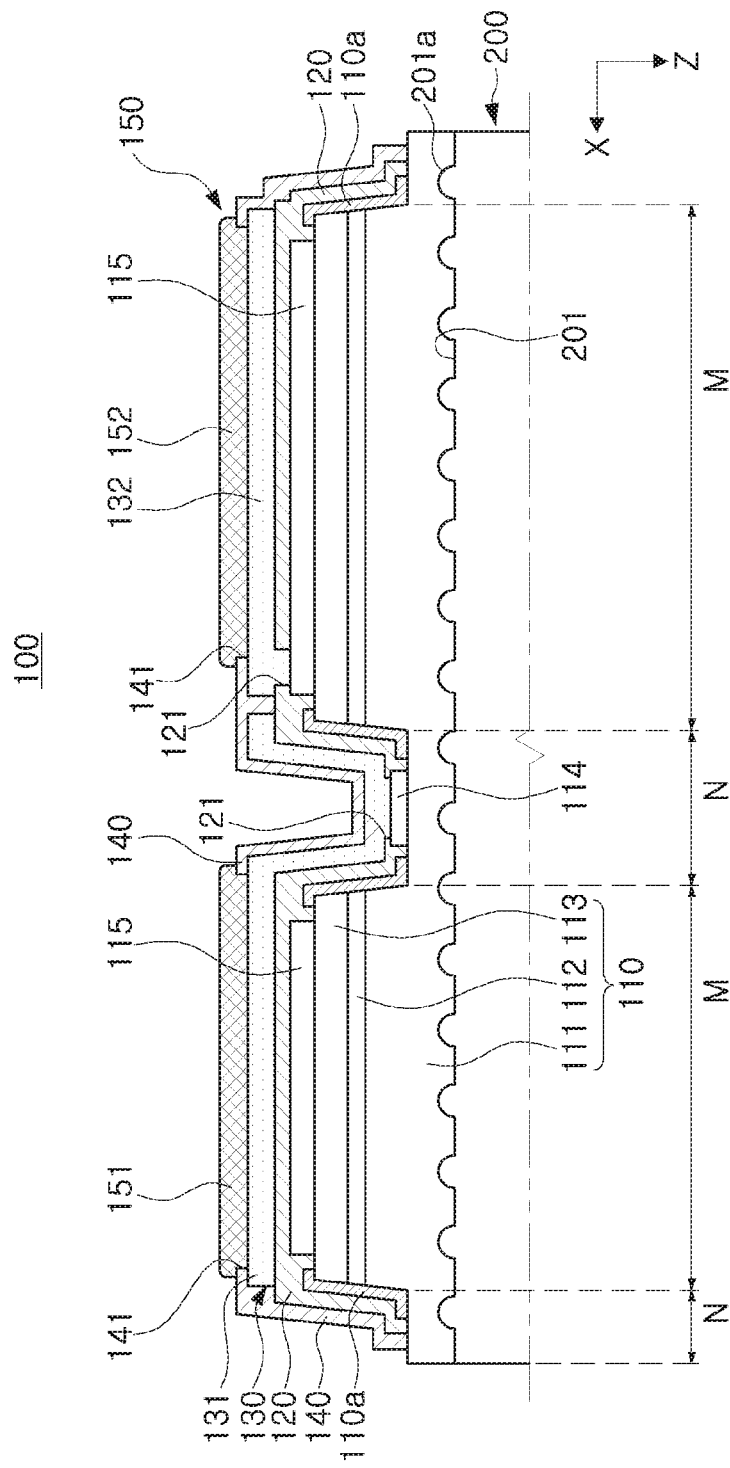
FIG. 7 is a cross-sectional view of an LED chip taken along line VI-VI' of FIG. 6.

FIG. 7 is a cross-sectional view of an LED chip taken along line VI-VI' of FIG. 6. FIG. 7 schematically illustrates the LED chip 100.

With reference to FIG. 7, the LED chip 100 includes a light emitting structure 110, a first insulating layer 120, an electrode layer 130, a second insulating layer 140, and an electrode pad 150.

The light emitting structure 110 may have a structure in which a plurality of semiconductor layers are stacked, and may include a first conductivity type semiconductor layer 111, an active layer 112, and a second conductivity type semiconductor layer 113 sequentially stacked based on the light guide unit 200.

The first conductivity type semiconductor layer 111 adjacent to the light guide unit 200 may include a semiconductor doped with an n-type impurity, and may include an n-type nitride semiconductor layer. A transparent substrate may be further included between the light guide unit 200 and the first conductivity type semiconductor layer 111. The second conductivity type semiconductor layer 113 may include a semiconductor doped with a p-type impurity, and may include a p-type nitride semiconductor layer. Positions of the first and second conductivity type semiconductor layers 111 and 113 may be changed and stacked according to at least one example embodiment. The first and second conductivity type semiconductor layers 111 and 113 may be formed using a material represented by an empirical formula $Al_xIn_yGa_{(1-x-y)}N$ (where $0 \leq x<1$, $0 \leq y<1$, and $0 \leq x+y<1$), for example, a material such as GaN, AlGaN, InGaN, AlInGaN, or the like.

The active layer 112 disposed between the first and second conductivity type semiconductor layers 111 and 113 may emit light having a desired (and/or alternatively predetermined) level of energy by recombination of electrons and holes. The active layer 112 may include a material having an energy band gap smaller than an energy band gap of the first and second conductivity type semiconductor layers 111 and 113. For example, when the first and second conductivity type semiconductor layers 111 and 113 are configured of a GaN-based compound semiconductor, the active layer 112 may include an InGaN-based compound semiconductor having an energy band gap smaller than an energy band gap of GaN. In addition, the active layer 112 may have a multiple quantum well (MQW) structure in which quantum well layers and quantum barrier layers are alternately stacked, for example, an InGaN/GaN structure. However, the active layer 112 is not limited thereto, a single quantum well (SQW) structure may be used for the active layer 112.

The light emitting structure 110 may include an etching area N in which the second conductivity type semiconductor layer 113, the active layer 112, and portions of the first conductivity type semiconductor layer 111 are etched, and a plurality of mesa areas M partially divided by the etching area N.

A first contact electrode 114 may be disposed on an upper surface of the first conductivity type semiconductor layer 111 exposed to the etching area N to be connected to the first conductivity type semiconductor layer 111, and a second contact electrode 115 may be disposed on upper surfaces of the plurality of mesa areas M to be connected to the second conductivity type semiconductor layer 113.

A passivation layer 110a formed of an insulation material may be provided on a lateral surface of the mesa area M to cover the active layer 112 exposed to the etching area N. The passivation layer 110a is selectively provided, and thus, may be omitted according to at least one example embodiment.

A first insulating layer 120 may have a structure entirely covering the light emitting structure 110, and may be provided on the light emitting structure 110. The first insulating layer 120 may be basically formed of a material having insulating properties, and may be formed by using an inorganic or organic material. For example, the first insulating layer 120 may be formed of an epoxy-based insulating resin. In addition, the first insulating layer 120 may include silicon oxide or silicon nitride, and for example, may include one selected from a group consisting of $SiO_2$, SiN, $SiO_xN_y$, $TiO_2$, $Si_3N_4$, $Al_2O_3$, TiN, AlN, $ZrO_2$, TiAlN, TiSiN, and the like.

The first insulating layer 120 may include a plurality of first openings 121 disposed on the first conductivity type semiconductor layer 111 exposed to the etching area N and the second conductivity type semiconductor layer 113, respectively. In detail, the first openings 121 may allow the first contact electrode 114 and the second contact electrode 115 to be partially exposed on the first and second conductivity type semiconductor layers 111 and 113, respectively.

The electrode layer 130 may be provided on the first insulating layer 120, and may be electrically connected to the first conductivity type semiconductor layer 111 and the second conductivity type semiconductor layer 113 through the first openings 121, respectively.

The electrode layer 130 may be insulated from the first and second conductivity type semiconductor layers 111 and 113 by the first insulating layer 120 entirely covering an upper surface of the light emitting structure 110. In addition, the electrode layer 130 may be connected to the first contact electrode 114 and the second contact electrode 115 exposed externally through the first openings 121 and connected to the first and second conductivity type semiconductor layers 111 and 113.

Electrical connections of the electrode layer 130 and the first and second conductivity type semiconductor layers 111 and 113 may be variously controlled by the first openings 121 provided in the first insulating layer 120. For example, according to the number and a disposition of the first openings 121, electrical connections of the electrode layer 130 and the first and second conductivity type semiconductor layers 111 and 113 may be variously changed.

The electrode layer 130 may be provided as at least one pair, for example, a first electrode layer 131 and a second electrode layer 132, for electrical insulation between the first and second conductivity type semiconductor layers 111 and 113. For example, the first electrode layer 131 is electrically connected to the first conductivity type semiconductor layer 111, and the second electrode layer 132 is electrically connected to the second conductivity type semiconductor layer 113. The first and second electrode layers 131 and 132 may be separated from each other to be electrically insulated.

The electrode layer 130 may include a material including one or more among materials such as gold (Au), tungsten (W), platinum (Pt), silicon (Si), iridium (Ir), silver (Ag), copper (Cu), nickel (Ni), titanium (Ti), chromium (Cr), and the like and alloys thereof.

The second insulating layer 140 may be provided on the electrode layer 130, and may entirely cover and protect the electrode layer 130. In addition, the second insulating layer 140 may include a second opening 141 allowing the electrode layer 130 to be partially exposed therethrough. The second opening 141 may be provided as a plurality of openings to allow the first electrode layer 131 and the second electrode layer 132 to be partially exposed, respectively.

The second insulating layer 140 may include a material the same as that of the first insulating layer 120.

The electrode pad 150 may include a first pad 151 and a second pad 152, and may be provided on the first and second electrode layers 131 and 132 partially exposed through the second openings 141, respectively. In addition, the electrode pad 150 may be electrically connected to the first conductivity type semiconductor layer 111 and the second conductivity type semiconductor layer 113 through the electrode layer 130. The first pad 151 and the second pad 152 may be respectively provided as a plurality of pads.

To implement a chip on board (COB) type structure through a flip chip bonding method, the first pad 151 and the second pad 152 may have the same orientation above the light emitting structure 110.

As illustrated in FIG. 5, the first pad 151 and the second pad 152 may be symmetrically disposed. The number and a dispositional structure of the first and second pads 151 and 152 may be variously changed as well.

The light guide unit 200 may be disposed on the other side of the LED chip 100, and may emit light generated by the LED chip 100 externally (see FIG. 4).

The light guide unit 200 may have a rod-shaped structure in a quadrangular shape extended in a longitudinal direction perpendicular to the other side of the LED chip 100. In detail, the light guide unit 200 may have a first surface 201 in contact with the other side of the LED chip 100, a second surface 202 opposing the first surface 201, and a third surface 203 disposed between the first surface 201 and the second surface 202 to connect the first surface 201 to the second surface 202.

The first surface 201 may define a light incident surface onto which light of the LED chip 100 is incident, and the second surface 202 and the third surface 203 may define a light emission surface from which light incident inside the light guide unit 200 is emitted externally.

A plurality of concave and convex structures 201a may be formed on the first surface 201 in contact with the LED chip 100. In at least one example embodiment, the concave and convex structure 201a having a dome-shaped convex shape is illustrated, but is not limited thereto. For example, the concave and convex structure 201a may have various forms such as a quadrangular structure, a triangular structure, or the like. In addition, the concave and convex structure 201a may be selectively formed and provided, such that it may be omitted.

The second surface 202 disposed to oppose the first surface 201 may have a substantially-flat planar structure.

FIG. 8A, FIG. 8B, and FIG. 8C are side views schematically illustrating various modifications of the shape of a light guide unit in the semiconductor light emitting device illustrated in FIG. 6. FIG. 8A, FIG. 8B, and FIG. 8C schematically illustrate various modifications of the shape of the second surface 202.

As illustrated in FIG. 8A, the second surface 202 may have a structure whose center is recessed toward the first surface 201. In addition, as illustrated in FIG. 8B, the second surface 202 may have a concave and convex structure 202a protruding externally. In addition, as illustrated in FIG. 8C, the second surface 202 may substantially have a dome-shaped curved structure protruding upwardly.

An angle in a spread of beams of light emitted externally may be adjusted through the recess structure, the concave and convex structure, or the dome-shaped curved structure.

The third surface 203 may extend from an edge of the first surface 201 and then connected to an edge of the second surface 202. In addition, the third surface 203 may be substantially coplanar with a lateral surface of the LED chip 100.

The third surface 203, for example, may be provided as four surfaces as the first surface 201 and the second surface 202 have a quadrangular shape. Therefore, for example, in a case in which the first surface 201 and the second surface 202 have a triangular shape, the third surface 203 may be provided as three surfaces.

The light guide unit 200 may be formed of a light transmitting material. As a material of the light guide unit 200, a material such as sapphire, Si, SiC, $MgAl_2O_4$, MgO, $LiAlO_2$, $LiGaO_2$, GaN, or the like may be used.

In the semiconductor light emitting device 10 according to at least one example embodiment, the LED chip 100 may have a height (thickness) in a range of around 7 μm to 9 μm, and the light guide unit 200 may have a height (thickness) in a range of around 150 μm to 550 μm. In addition, a size (cross sectional area) of the LED chip 100 may be around 200 μm$^2$ or less, for example, 10 μm×10 μm. As described above, as a size of the LED chip 100 is reduced, a thickness of the light guide unit 200 may be relatively increased. Thus, the semiconductor light emitting device 10 may have a rod-shaped structure in which a height ratio (aspect ratio) compared to an area is significantly high. In addition, most of the semiconductor light emitting device 10 may be occupied by the light guide units 200.

For example, when the semiconductor light emitting device 10 according to at least one example embodiment is moved through a vacuum chuck V, the semiconductor light emitting device 10 may be handled while the light guide unit 200 is clamped by the vacuum chuck (see FIG. 2). In other words, a micro-level device of 200 μm$^2$ or less difficult to handle in a pick-and-place method using a vacuum chuck may be easily implemented by allowing the light guide unit 200 to have a relatively high aspect ratio, and thus, a precision pick-and-place method may be easily implemented.

FIG. 9A and FIG. 9B are side views schematically illustrating a semiconductor light emitting device according to at least one example embodiment. FIGS. 9A and 9B schematically illustrate a semiconductor light emitting device according to example embodiments.

As illustrated in FIGS. 9A and 9B, the semiconductor light emitting device 10 may further include a wavelength conversion layer 300 covering a surface of the light guide unit 200. In detail, as illustrated in FIG. 9A, the wavelength conversion layer 300 may cover a surface of the light guide unit 200. In addition, as illustrated in FIG. 9B, the wavelength conversion layer 300 may cover a surface of the light guide unit 200 and a lateral surface of the LED chip 100.

The wavelength conversion layer 300 may be formed of a light transmitting material to allow light from the light guide unit 200 to be emitted externally. As the light transmitting material, a resin such as silicon, epoxy, or the like may be used.

The wavelength conversion layer 300 may include a wavelength conversion material excited by light generated by the LED chip 100 and then emitting light having a different wavelength, for example, may include at least one or more types of phosphors, by which light may be emitted by being adjusted to have different colors.

For example, when the LED chip 100 emits blue light, yellow, green, red and/or orange phosphors may be combined therewith to allow white light to be emitted. In addition, at least one among the LED chips 100 emitting violet, blue, green, red, and infrared light may be included. In this case, the LED chip 100 may adjust a color rendering index (CRI) from '40' to around '100'. In addition, a color temperature may be adjusted from around 2000K to around 20000K, and a variety of types of white light may be generated. In addition, violet, blue, green, red, orange visible light or infrared light is generated as needed, and a color may be adjusted to be appropriate for an ambient atmosphere or for people's moods. In addition, light having a special wavelength capable of promoting plant growth may be generated.

Figure 10:
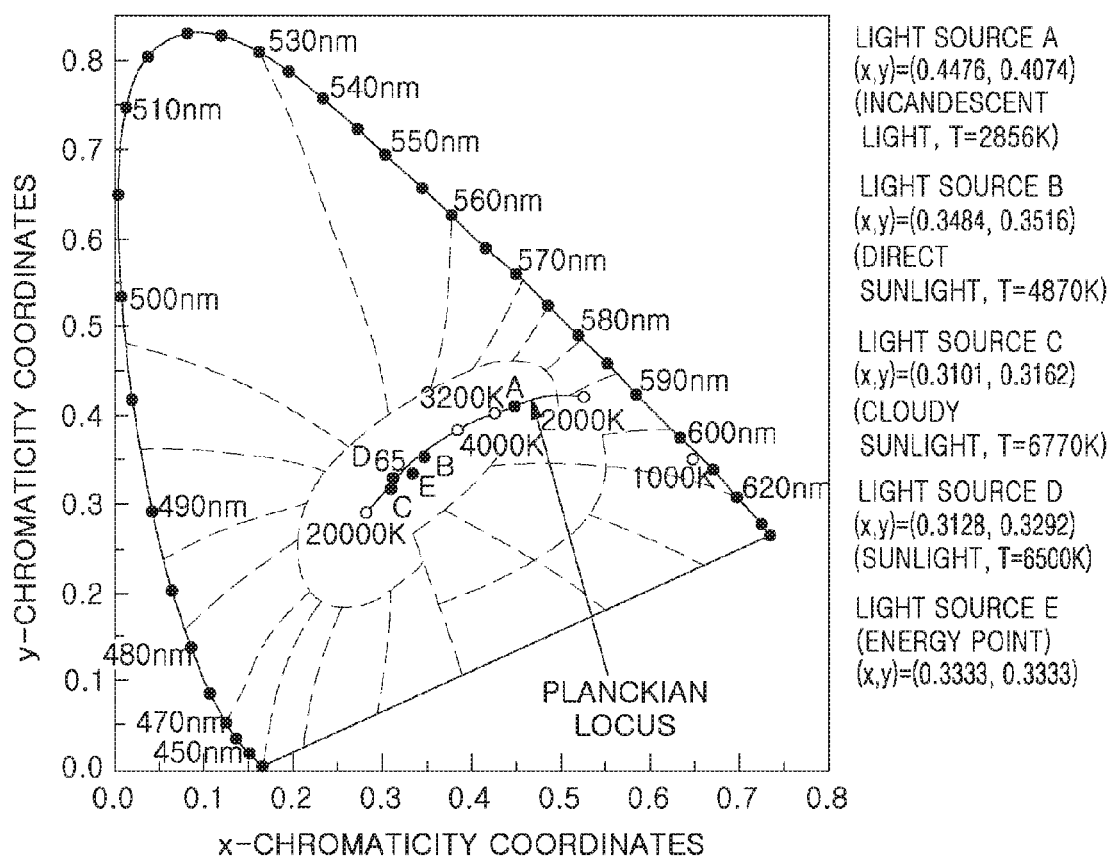
FIG. 10 is a CIE 1931 color space diagram for describing a wavelength conversion material according to at least one example embodiment.

White light obtained by combining a blue LED chip with yellow, green, red phosphors and/or green and red LED chips may have two or more peak wavelengths, and coordinates (x, y) thereof on the CIE 1931 chromaticity diagram illustrated in FIG. 10 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and a black body radiation spectrum. A color temperature of the white light may be within a range of around 2000K to around 20000K.

FIG. 10 is a CIE 1931 color space diagram for describing a wavelength conversion material according to at least one example embodiment. In FIG. 10, white light in the vicinity of a point E (0.3333, 0.3333) below the blackbody radiation spectrum may be in a state in which light of a yellow-based component becomes relatively weak. This white light may be used as an illumination light source of a region in which a relatively bright or refreshing mood may be provided to the naked eye. Thus, a lighting device product using white light in the vicinity of the point E (0.3333, 0.3333) below the blackbody radiation spectrum may be effective for use in retail spaces in which groceries, clothing, or the like are for sale.

Phosphors may be represented by the following empirical formulae and have colors as below.

Oxide-based Phosphors: Yellow and green $Y_3Al_5O_{12}$:Ce, $Tb_3Al_5O_{12}$:Ce, $Lu_3Al_5O_{12}$:Ce Silicate-based Phosphors: Yellow and green $(Ba,Sr)_2SiO_4$:Eu, yellowish-orange $(Ba,Sr)_3SiO_5$:Ce Nitride-based Phosphors: Green β-SiAlON:Eu, yellow $La_3Si_6N_{11}$:Ce, yellowish-orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) (here, Ln is at least one selected from a group consisting of a group IIIa element and a rare-earth element, and M is at least one selected from a group consisting of calcium (Ca), barium (Ba), strontium (Sr), and magnesium (Mg))

Fluoride-based Phosphors: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A composition of phosphors should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based terbium (Tb), lutetium (Lu), scandium (Sc), gadolinium (Gd), or the like. In addition, Eu or the like, an activator, may be substituted with Ce, Tb, praseodymium (Pr), erbium (Er), ytterbium (Yb), or the like, according to a required level of energy, and an activator alone or a sub-activator or the like, for modification of characteristics thereof, may additionally be used.

In further detail, in the case of a fluoride-based red phosphor, in order to improve reliability thereof at high temperatures and high humidity, phosphors may be coated with fluoride not containing Mn or a phosphor surface or a fluoride-coated surface of phosphors, coated with a fluoride not containing Mn, may further be coated with an organic material. In the case of the fluoride-based red phosphor as described above, a narrow full width at half maximum of 40 nm or less may be obtained, unlike in the case of other phosphors, and thus, the fluoride-based red phosphors may be used in high-resolution TV sets such as UHD TVs.

In addition, as a phosphor substitute in the case of the wavelength conversion material, materials such as a quantum dot (QD) or the like may be used, and a mixture of a phosphor and a quantum dot, or a QD alone, may be used.

The quantum dot (QD) may have a core-shell structure using a group III-V compound semiconductor material or a group II-VI compound semiconductor material. For example, the quantum dot may have a core formed using cadmium selenide (CdSe), indium phosphide (InP), or the like, and a shell formed using zinc sulfide (ZnS), zinc selenide (ZnSe), or the like. Further, the QD may have a ligand for stabilization of the core and the shell. For example, the core may have a diameter of approximately 1 nm to 30 nm, in detail, approximately 3 nm to 10 nm. The shell may have a thickness of approximately 0.1 nm to approximately 20 nm, in detail, 0.5 nm to 2 nm.

The quantum dot may implement various colors of light depending on a size thereof. In detail, in a case in which the quantum dot is used as a phosphor substitute, the quantum dot may be used as a red or green phosphor. In a case of using the quantum dot, a narrow full width at half maximum of, for example, about 35 nm, may be obtained.

On the other hand, FIG. 3 schematically illustrates a modification of the shape of a light source module according to at least one example embodiment.

As illustrated in FIG. 3, in a plurality of semiconductor light emitting devices 10, portions thereof protruding upwardly from the black matrix 30 may be covered with a wavelength conversion layer 400. In other words, the wavelength conversion layer 400 may cover light guide units 200 of the semiconductor light emitting devices 10 on the black matrix 30.

The wavelength conversion layer 400 may be formed of a light transmitting material to allow light of the semiconductor light emitting device 10 to be emitted externally. For example, as the light transmitting material, a resin such as silicon, epoxy, or the like may be used.

The wavelength conversion layer 400 may include a wavelength conversion material excited by light generated by the semiconductor light emitting device 10 and emitting light having different wavelengths, for example, at least one kind of phosphor, by which it is adjusted to emit light having different colors. In this case, a phosphor included in the wavelength conversion layer 400 may be a different kind of phosphor from a phosphor included in the wavelength conversion layer 300 with which a surface of a light guide unit 200 of a semiconductor light emitting device 10' illustrated in FIGS. 9A and 9B is covered.

As described above, the light source module 1 according to at least one example embodiment may be provided in a scheme in which a plurality of semiconductor light emitting devices 10 having a rod-shaped structure are easily inserted into holes 31 of the black matrix 30 formed in advance, respectively. One or more of the light emitting devices 10 may be selectively removably coupled with one or more of the connection pads on the substrate 20. Removably coupling a light emitting device 10 with a connection pad may include removing and replacing a semiconductor light emitting device 10 from a connection pad. One or more of the light emitting devices 10 may be interchangeably swapped from one or more of the connection pads. A light emitting device 10 may be selectively removed and replaced, interchangeably swapped, some combination thereof, or the like based on a determination that the light emitting device is defective after lighting is checked. Thus, an ease of maintenance of the light source module 1 may be improved.

Specifically, a plurality of semiconductor light emitting devices 10 may be transferred and handled in a pick-and-place method through control of a vacuum chuck V, such that precision of operations may be improved and working efficiency may be expected through automation. The vacuum chuck V may be controlled according to command signals generated at one or more computer systems. The one or more computer systems may include a processor that may execute one or more computer-readable instructions to generate commands to control the vacuum chuck V.

Figure 11:
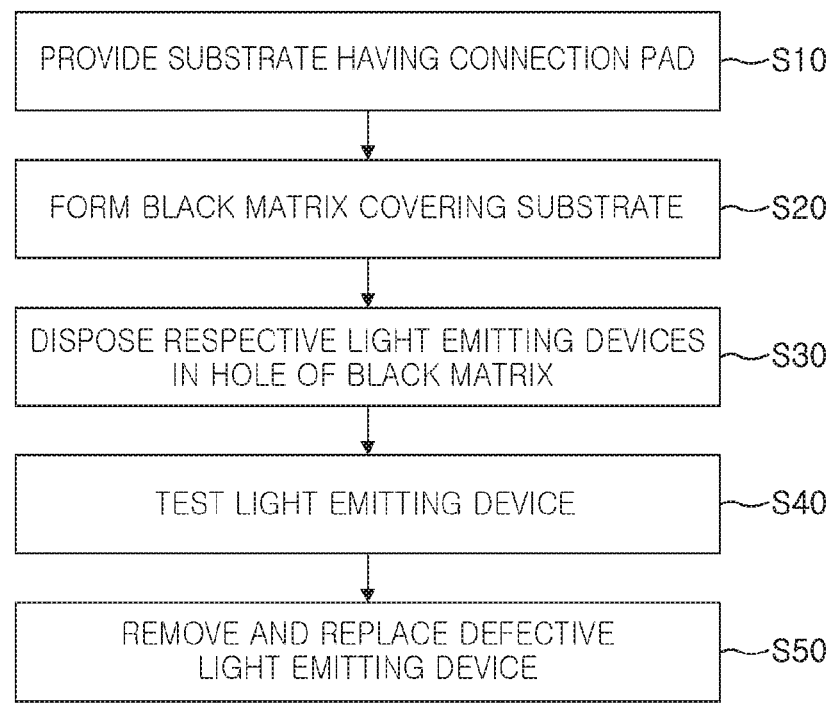
FIG. 11 is a flow chart schematically illustrating a method of manufacturing a light source module according to at least one example embodiment.

FIG. 11 is a flow chart schematically illustrating a method of manufacturing a light source module according to at least one example embodiment. FIG. 12A, FIG. 12B, FIG. 12C, FIG. 12D, and FIG. 12E are cross-sectional views schematically illustrating a method of manufacturing a light source module according to at least one example embodiment. As described further below, one or more operations of the method may be performed by at least a portion of a controller device 2200.

With reference to FIGS. 11, and 12A to 12E, a method of manufacturing a light source module according to at least one example embodiment of the present inventive concepts is illustrated. The method may be implemented, in part or in full, by a controller device 2200 that includes at least a processor. The controller device 2200 may include a memory that stores computer-readable instructions. The controller device 2200 may include at least a vacuum chuck V, and/or the computer system may be communicatively coupled to a vacuum chuck V, such that the processor may control the vacuum chuck based on executing computer-readable instructions. The processor may execute computer-readable instructions to perform one or more operations of the method illustrated in FIG. 11 and FIGS. 12A-12E. In some example embodiments, the processor may execute computer-readable instructions to control one or more various devices to implement one or more operations of the method.

Figure 12A:
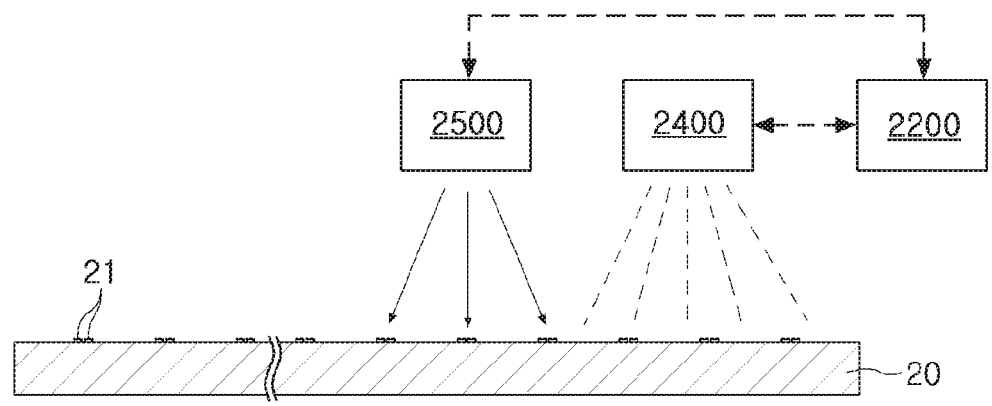
FIG. 12A, FIG. 12B, FIG. 12C, FIG. 12D, and FIG. 12E are cross-sectional views schematically illustrating a method of manufacturing a light source module according to at least one example embodiment.

FIG. 12A schematically illustrates an operation of providing a substrate having a connection pad (S10 of FIG. 11). As shown, the substrate may be provided based on the controller device 2200 controlling a substrate providing device 2400 to provide the substrate 20. The substrate providing device 2400 may provide the substrate 20 according to one or more various processing, including lamination, chemical vapor deposition, atomic layer deposition, some combination thereof, or the like. In some example embodiments, the substrate provider device 2400 is a mechanical device that moves a pre-fabricated substrate 20 to a particular position to provide the substrate 20.

The substrate 20 may be a printed circuit board, for example, a FR4-type printed circuit board (PCB), or an easily deformable flexible printed circuit board. The printed circuit board may be formed using an organic resin material including epoxy, triazine, silicon, polyimide, or the like and other organic resin materials, may be formed using a ceramic material such as silicon nitride, AlN, $Al_2O_3$, or the like, or may be formed using a metal or a metal compound as in MCPCB, MCCL, or the like. The substrate 20 may have a plate structure having a substantially quadrangular shape and this illustrates a structure of a substrate 20 according to at least one example embodiment by way of example, and thus, is not limited thereto.

The substrate 20 may have a plurality of chip mounting areas, and connection pads 21 may be disposed in the chip mounting areas, respectively. As shown in FIG. 12A, the controller device 2200 may control a connection pad 21 provider device 2500 to dispose the connection pads 21 in the chip mounting areas. The controller device 2200 may control the device 2500 to dispose the connection pads 21 on the substrate 20 according to a particular pattern. The connection pads 21 may be formed in the form of a conductive thin film, and for example, may include a copper foil. The connection pads 21 may be connected to external power. The connection pads 21 may be formed on the substrate 20 according to a pattern, such that the connection pads 21 may comprise a pattern of connection pads 21 on the substrate 20.

Figure 12B:
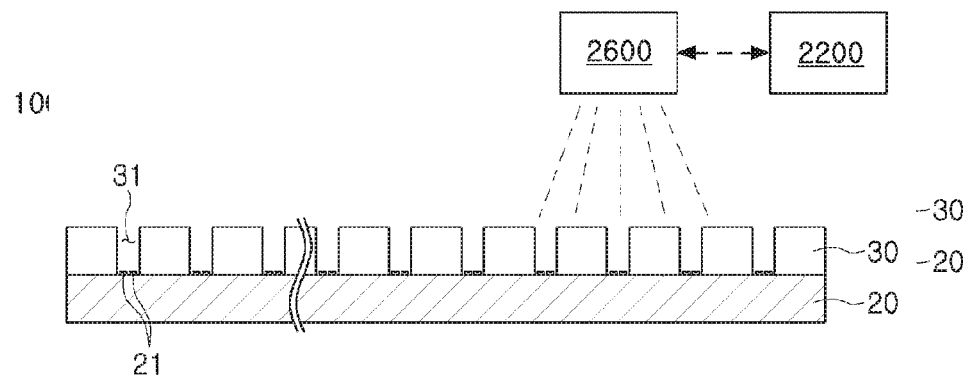

FIG. 12B schematically illustrates an operation of forming a black matrix having a plurality of holes on the substrate (S20 of FIG. 11). The operation may be performed based on controller device 2200 controlling a black matrix forming device 2600 to form the black matrix 30. The device 2600 may form the black matrix 30 according to one or more various processes, including chemical vapor deposition, atomic layer deposition, lamination, some combination thereof, or the like.

The black matrix 30, for example, may be formed in a method of forming a pattern by depositing pigment on an upper surface of the substrate 20 and etching the same.

The black matrix 30 may have the plurality of holes 31 in positions thereof corresponding to the chip mounting areas. As a result, the holes 31 may comprise a pattern of holes 31 that corresponds to the pattern of connection pads 21 such that the connection pads 21 are each aligned with separate, respective holes 31. The plurality of holes 31 may have a structure passing through the black matrix 30. The substrate 20 is covered with the black matrix 30, and the chip mounting areas of the substrate 20 including the connection pads 21 may not be covered with the black matrix 30 due to the plurality of holes 31.

The plurality of holes 31 may be arranged on the substrate 20 to form a plurality of columns in a transverse direction and a longitudinal direction. For example, the plurality of holes 31 may be arranged in a checkerboard pattern or a matrix pattern.

A lateral surface of the black matrix 30 may be substantially coplanar with a lateral surface of the substrate 20.

Figure 12C:
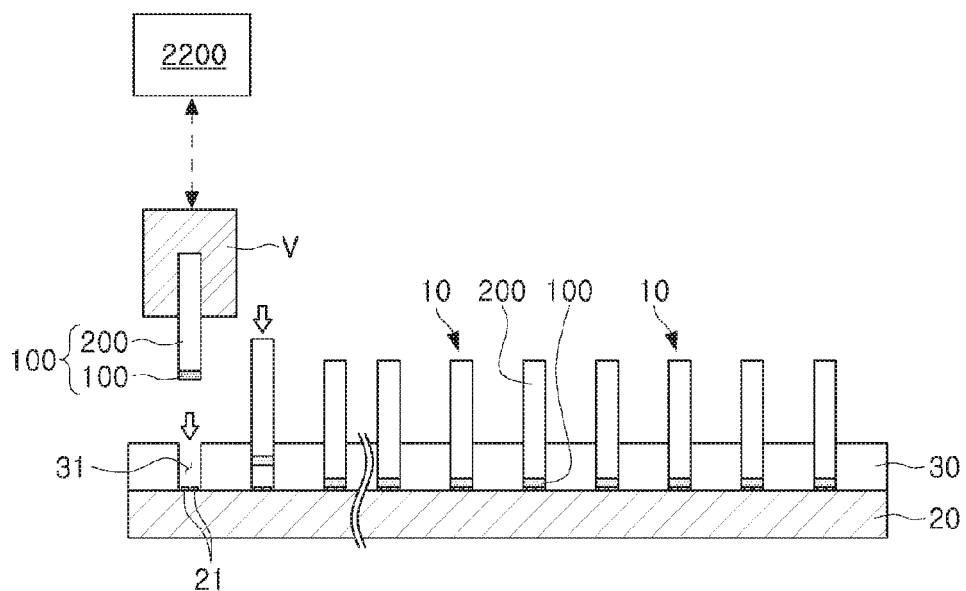

FIG. 12C schematically illustrates an operation of disposing a plurality of semiconductor light emitting devices in the black matrix (S30 of FIG. 11).

The plurality of semiconductor light emitting devices 10 may be clamped through a vacuum chuck V respectively, and inserted into the plurality of holes 31 in a pick-and-place method respectively to then be disposed therein. In addition, the plurality of semiconductor light emitting devices 10 may be electrically coupled to the connection pads 21. The light emitting devices 10 may be electrically coupled with separate, respective connection pads 21 based on the light emitting devices 10 being inserted into separate, respective holes 31 that correspond to the respective connection pads 21. The light emitting devices 10 may be clamped and inserted into the holes 31 based on a controller device 220 controlling the vacuum chuck V to clamp and insert the light emitting devices 10 in the respective holes 31. The controller device 2200 may select particular holes 31 in which to insert particular light emitting devices 10, and the controller device 2200 may control the vacuum chuck V to insert the particular light emitting devices 10 into the corresponding selected holes 31 with which the controller device 2200 associates the particular light emitting devices 10. The controller device 2200 may be communicatively coupled to a sensor device (e.g., sensor device 2300) and may select a hole 31 and control a vacuum clamp V to insert a particular light emitting device 10 in the selected hole 31 based on processing sensor data generated by the sensor device 2300.

Figure 12D:
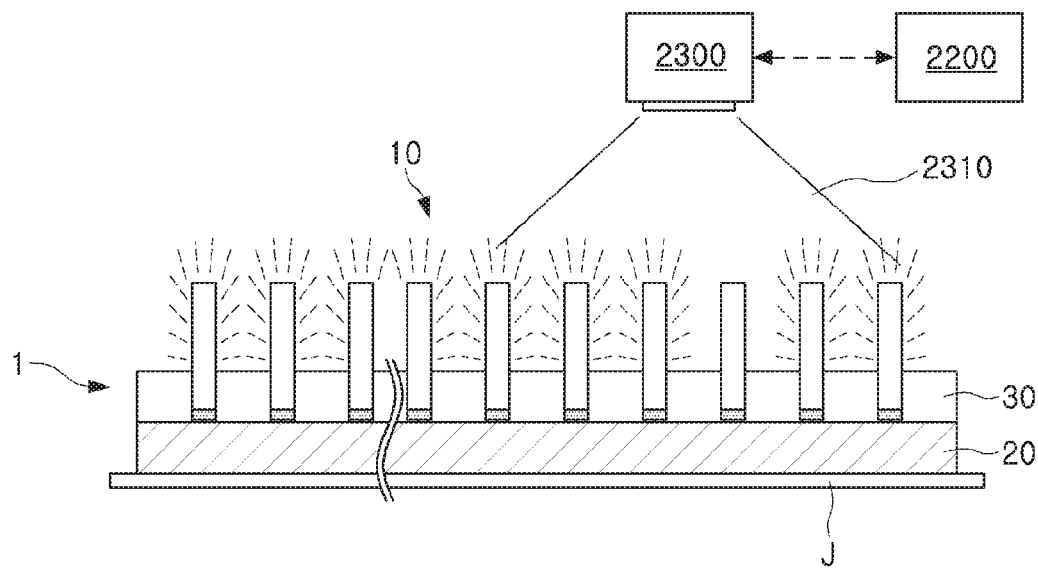

FIG. 12D schematically illustrates an operation of testing the plurality of semiconductor light emitting devices (S40 of FIG. 11).

As a light source module 1 uses a plurality of semiconductor light emitting devices 10 as a light source, a test with respect to the plurality of semiconductor light emitting devices 10 before being shipped as a final product may be performed. The light source module 1 may be located in a jig J for testing, and connected to external driving power. Testing may include controlling a supply of electrical power to one or more of the light emitting devices 10 through one or more connection pads 21, such that at least a threshold amount of electrical power is supplied to the one or more light emitting devices 10 through the one or more connection pads 21. The controller device 2200 may control the supply of electrical power to the one or more light emitting devices 10.

The testing may include monitoring light emissions by the one or more light emitting devices 10. Such monitoring may be performed by the controller device 2200. Such monitoring may include controlling a sensor device 2300 to capture one or more images of the one or more light emitting devices 10 within a field of view 2310 of the sensor device 2300. Such monitoring may include processing the images (also referred to herein as sensor data) to determine whether the one or more light emitting devices 10 emit light if and/or when electrical power is supplied to the corresponding one or more connection pads to which the one or more light emitting devices 10 are electrically coupled to drive the one or more light emitting devices. For example, a light emitting device 10 may be determined to be defective based on determining that the light emitting device 10 emits less than a threshold amount of light if and/or when electrical power is supplied to drive the light emitting device 10.

When it is determined that there is no defectiveness in a result of the driving test with respect to respective semiconductor light emitting devices 10, it may be shipped as a final product or may be transferred to a process in which the light source module 1 is to be mounted in a display apparatus.

Figure 12E:
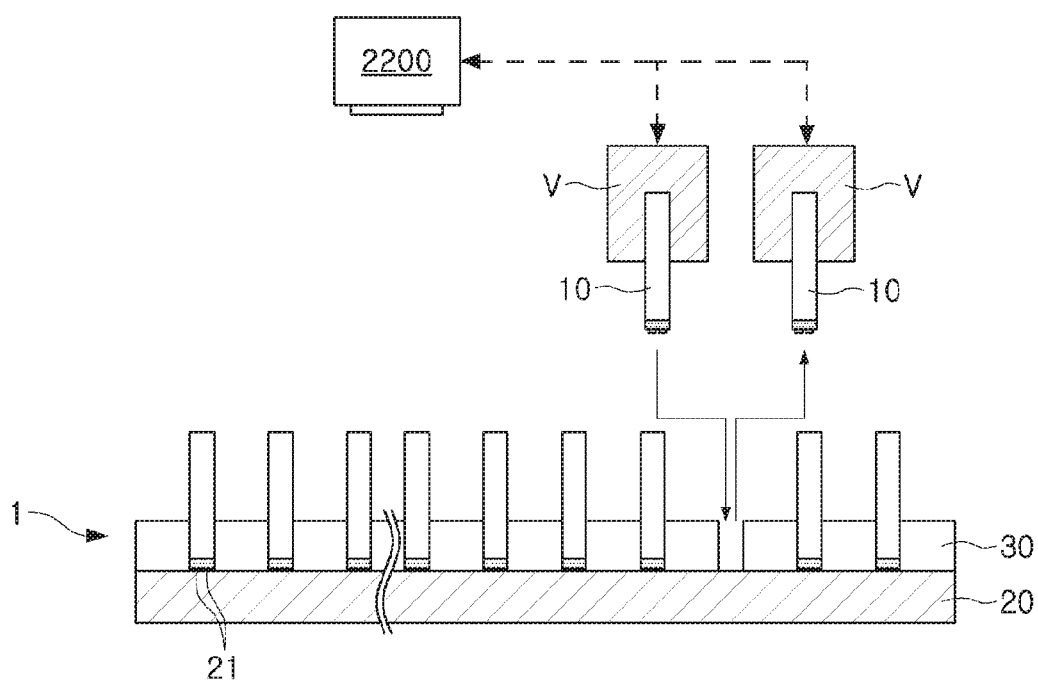

FIG. 12E schematically illustrates an operation of selectively removing a defective semiconductor light emitting device among the plurality of semiconductor light emitting devices and replacing the same with other semiconductor light emitting devices (S50 of FIG. 11).

As a result of a test with respect to the plurality of semiconductor light emitting devices 10, if it is determined that some semiconductor light emitting devices 10 are defective, the corresponding semiconductor light emitting devices 10 are selectively removed through the vacuum chuck V, and may be replaced with one or more other semiconductor light emitting devices 10. A controller device 2200 may generate command signals to control the vacuum chuck V to clamp and remove a semiconductor light emitting device 10 from a hole 31 based on a determination that the semiconductor light emitting device 10 is defective. The controller device 2200 may generate command signals to control the vacuum chuck V to clamp and insert a replacement semiconductor light emitting device 10 in the hole 31, such that the defective semiconductor light emitting device 10 is replaced. The replacement semiconductor light emitting device 10 may be a device that is inserted in another hole 31, such that a defective semiconductor light emitting device 10 may be replaced by another semiconductor light emitting device 10 from another hole 31 on the substrate 20.

After replacement is completed, the test with respect to the plurality of semiconductor light emitting devices 10 may be performed again.

Figure 13:
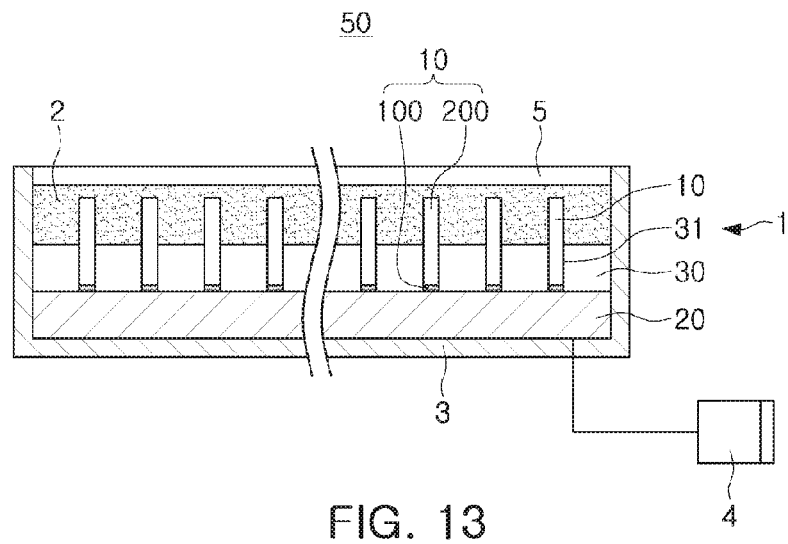
FIG. 13 is a cross-sectional view schematically illustrating a display apparatus according to at least one example embodiment.
Figure 14:
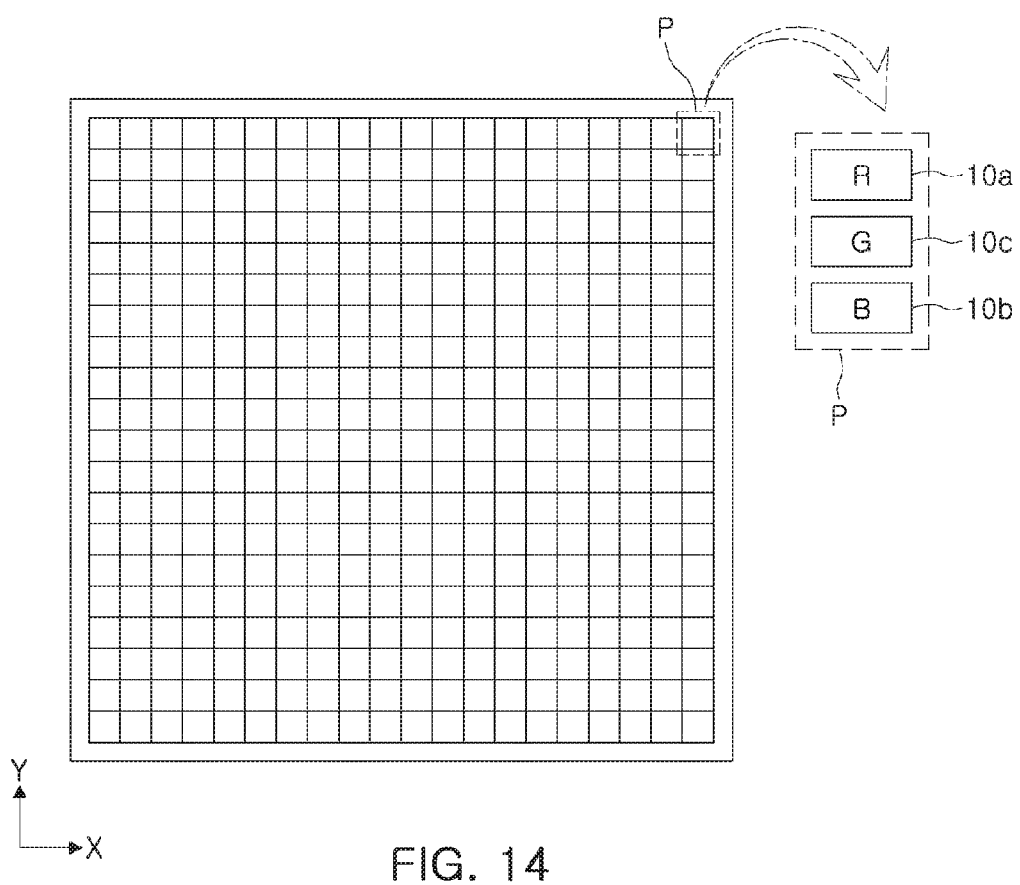
FIG. 14 is a plan view schematically illustrating arrangements of unit pixels in the display apparatus of FIG. 13.
Figure 15A:
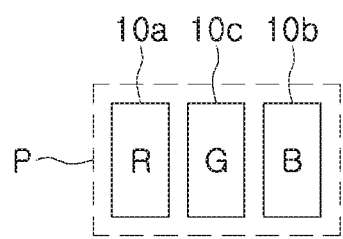
FIG. 15A and FIG. 15B are plan views schematically illustrating an arrangement structure of sub-pixels configuring a unit pixel according to at least one example embodiment.
Figure 15B:
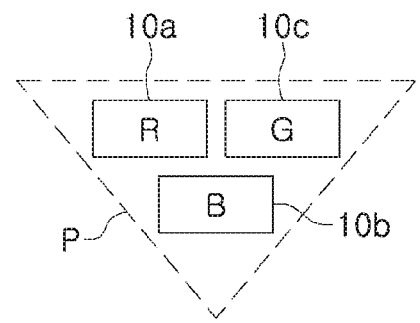

FIG. 13 is a cross-sectional view schematically illustrating a display apparatus according to at least one example embodiment. FIG. 14 is a plan view schematically illustrating arrangements of unit pixels in the display apparatus of FIG. 13. FIG. 15A and FIG. 15B are plan views schematically illustrating an arrangement structure of sub-pixels configuring a unit pixel according to at least one example embodiment. With reference to FIGS. 13 to 15, a display apparatus 50 according to at least one example embodiment of the present inventive concepts is described.

With reference to FIGS. 13 and 14, the display apparatus 50 according to at least one example embodiment of the present inventive concepts may include a light source module 1, a cover layer 2, and a housing 3. The display apparatus 50 may further include a driving unit 4 driving the light source module 1.

The light source module 1 may include a substrate 20, a black matrix 30 covering the substrate 20 and having a plurality of holes 31, and a plurality of semiconductor light emitting devices 10 detachably disposed in the plurality of holes 31.

In at least one example embodiment, the light source module 1 may have a configuration and a structure similar to those of the light source module 1 according to at least one example embodiment illustrated in FIG. 1. Detailed descriptions of respective components of the light source module 1 may be understood with reference to the above-described example embodiment (for example, with reference to FIG. 1). In addition, the semiconductor light emitting device 10 of the light source module 1 may have a configuration and a structure similar to those of the semiconductor light emitting device 10 according to at least one example embodiment illustrated in FIGS. 4 to 9. Detailed descriptions of respective components of the semiconductor light emitting device 10 may be understood with reference to the above-described example embodiment (for example, with reference to FIG. 4).

The plurality of semiconductor light emitting devices 10 arranged on the substrate 20 may implement a unit pixel P having three or four adjacent semiconductor light emitting devices as a single bundle. In other words, each of the three or four semiconductor light emitting devices 10 configuring one unit pixel P may be sub-pixels of the corresponding unit pixel P. For example, when the unit pixel P is configured of three sub-pixels, the three sub-pixels may be configured as a semiconductor light emitting device 10a emitting red (R) light, a semiconductor light emitting device 10b emitting blue (B) light, and a semiconductor light emitting device 10c emitting green (G) light, respectively. For example, when the unit pixel P is configured of four sub-pixels, the four sub-pixels may be configured as one semiconductor light emitting device 10a emitting red (R) light, one semiconductor light emitting device 10b emitting blue (B) light, and two semiconductor light emitting devices 10c emitting green (G) light, respectively. The configuration may be variously changed, but is not limited thereto.

The plurality of unit pixels P may be arranged to form a plurality of columns in a longitudinal direction and a transverse direction to correspond to a size of the substrate 20.

A plurality of semiconductor light emitting devices 10 configuring respective unit pixels P, for example, may be arranged in a structure in which they are arranged to be adjacent to each other in a longitudinal direction. In addition, as illustrated in FIG. 15A, the plurality of semiconductor light emitting devices 10a, 10b, and 10c may also be arranged in a transverse direction. In addition, as illustrated in FIG. 15B, the plurality of semiconductor light emitting devices 10a, 10b, and 10c may be arranged in a triangle shape. In addition, the plurality of semiconductor light emitting devices 10 configuring respective unit pixels P may be arranged in various structures.

In a state in which the plurality of semiconductor light emitting devices 10 are disposed in the plurality of holes 31, respectively, portions of the semiconductor light emitting devices 10 may protrude upwardly from the black matrix 30. For example, a light guide unit 200 of a respective semiconductor light emitting device 10 may partially protrude upwardly from the black matrix 30.

The black matrix 30 and the plurality of semiconductor light emitting devices 10 may be covered by the cover layer 2. Thus, the portions of the plurality of semiconductor light emitting devices 10 protruding upwardly from the black matrix 30 may be embedded inside the cover layer 2.

The cover layer 2 may be formed of a resin material having light transmittance, and for example, may include polycarbonate (PC), polymethyl methacrylate (PMMA), acryl, or the like.

The cover layer 2 may include a light scattering material within a range of about 3% to about 15%. As the light scattering material, for example, one or more selected from a group consisting of $SiO_2$, $TiO_2$, and $Al_2O_3$ may be used. If less than 3% of a light scattering material is included, it may be difficult to expect a sufficient light scattering effect. In addition, if more than 15% of a light scattering material is included, an amount of light emitted externally through the cover layer 2 may be reduced, such that light extraction efficiency may be reduced.

The light scattering material may also be selectively included or omitted according to at least one example embodiment.

On the other hand, a polarizing filter layer 5 covering the cover layer 2 may be further disposed on an upper surface of the cover layer 2. However, the polarizing filter layer 5 is not an essential component constituting the display apparatus 50 according to the present inventive concepts, and thus it may be omitted.

The driving unit 4 may control operations of the plurality of semiconductor light emitting devices 10. The driving unit 4 may be connected to the substrate 20 of the light source module 1 to then be connected to the plurality of semiconductor light emitting devices 10 through the connection pads 21 of the substrate 20.

The driving unit 4 may provide external driving power by converting the external driving power into a current source appropriate for driving the semiconductor light emitting devices 10. For example, the driving unit 4 may include an AC-DC converter, a rectifier circuit component, a fuse, and the like. In addition, the driving unit 4 may further include a communications module, which may implement remote control in some cases.

The housing 3 may accommodate the light source module 1, and may protect the light source module 1 from an external environment.

The housing 3 may perform a function of a frame supporting the light source module 1, and a function of a heat sink for emitting heat generated by the light source module 1 externally. To this end, the housing 3 may be formed of a durable material having relatively high thermal conductivity, and for example, may include a metallic material such as aluminum (Al), a heat dissipating resin, or the like.

As described above, the display apparatus 50 according to at least one example embodiment implements a unit pixel P by using a light emitting diode (LED) formed of an inorganic material. Thus, a problem of an organic light emitting diode (OLED) according to the related art, for example, disadvantages in that the OLED is vulnerable to humidity and moisture as an organic material is used, a service life is relatively short in comparison with an inorganic material, and manufacturing costs may increase as an expensive organic material is used, may be solved.

Meanwhile, an optical design of the display apparatus 50 using the light emitting diode (LED) may be variously changed depending on a product form, a location, and a purpose thereof. For example, as described in at least one example embodiment, the display apparatus 50 may use the semiconductor light emitting devices 10 emitting light to implement a unit pixel P, and further, may be used as a lighting apparatus irradiating light on a wide area.

In addition, with the display apparatus 50, visible light wireless communications technology in which a unique purpose of the semiconductor light emitting device 10 using an LED and the use thereof as a communications means may be implemented at the same time may also be carried out by adding a communications function thereto. In detail, the semiconductor light emitting device 10 using an LED has a relatively long service life and excellent power efficiency, implements various colors, has a fast switching speed for digital communications, and may be digitally controlled, in comparison with those of existing light sources.

The visible light wireless communications technology is wireless communications technology for wirelessly transmitting information using light in a visible wavelength band, which is light perceptible to the human eye. The visible light wireless communications technology is distinguished from existing wired optical communications technology and infrared light wireless communications, in terms of using light in a visible light wavelength band, and distinguished from wired optical communications technology in that a communications environment is wireless.

In addition, the visible light wireless communications technology has convenience in that it may be freely used without regulation or authorization in terms of using a frequency unlike RF wireless communications, differentiation that physical security is excellent and a user may visually confirm a communications link, and features of convergence technology for obtaining a unique purpose of alight source and a communications function at the same time.

Figure 16:
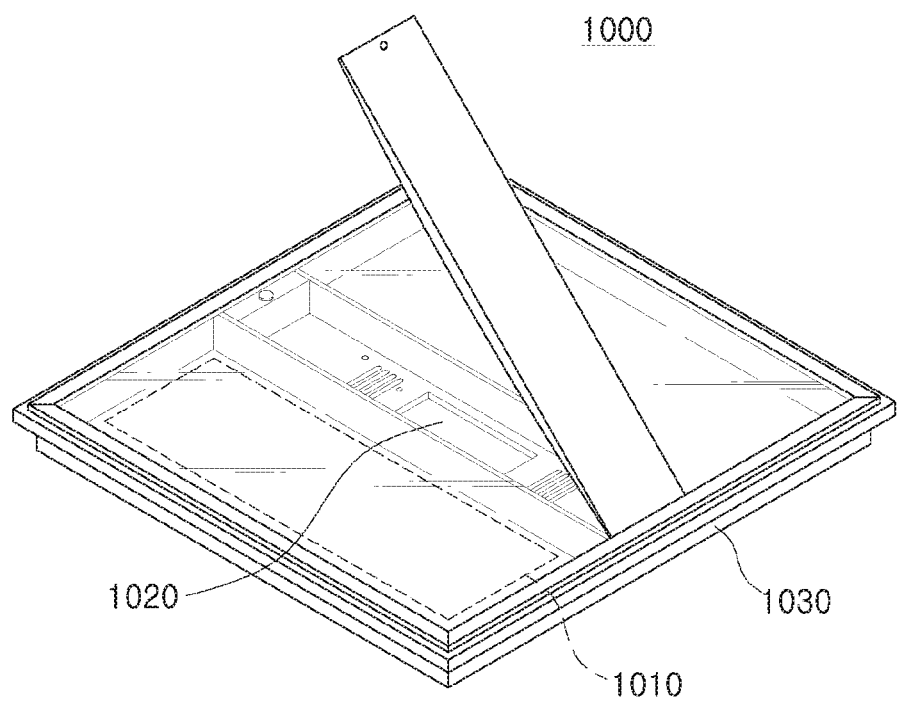
FIG. 16 is a perspective view of a flat lighting apparatus employing a light source module according to at least one example embodiment.

FIG. 16 is a perspective view of a flat lighting apparatus employing a light source module according to at least one example embodiment.

With reference to FIG. 16, a flat lighting apparatus 1000 may include alight source module 1010, a power supply device 1020, and a case 1030. According to at least one example embodiment of the present inventive concepts, the light source module 1010 may include a substrate, a black matrix, and a plurality of semiconductor light emitting devices (see FIG. 1). The power supply device 1020 may include a light source module driving unit.

The light source module 1010 may be formed to have a substantially planar form. According to at least one example embodiment of the present inventive concepts, the light source module may include a plurality of semiconductor light emitting devices, and a controller storing driving information of the plurality of semiconductor light emitting devices.

The power supply device 1020 may be configured to supply power to the light source module 1010. The case 1030 may include an accommodating space in which the light source module 1010 and the power supply device 1020 are accommodated, and may be formed in the hexahedral form open in one lateral surface thereof, but it is not limited thereto. The light source module 1010 may be disposed to emit light toward the one open side of the case 1030.

Figure 17:
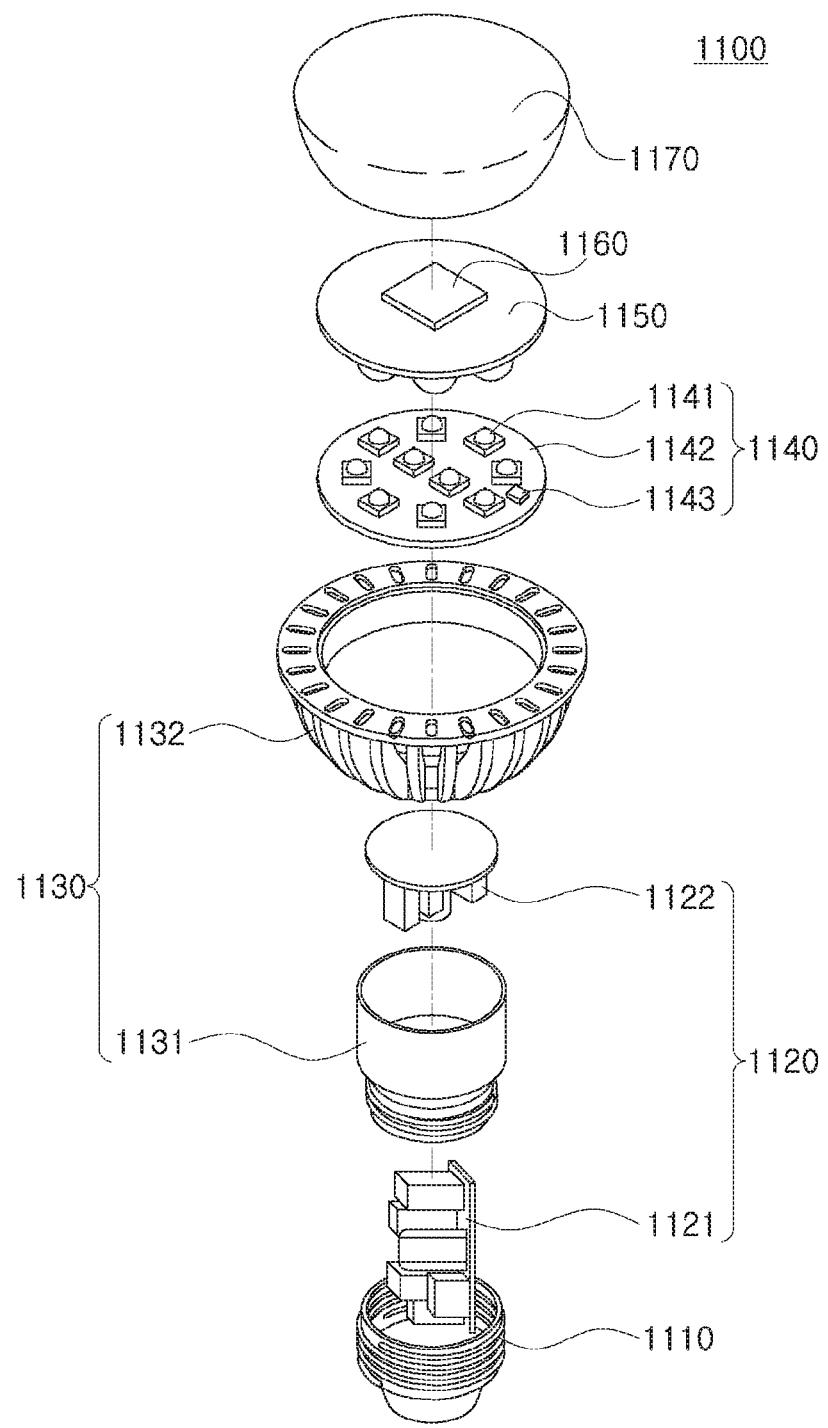
FIG. 17 is an exploded perspective view of a lamp including a light source module and a communications module according to at least one example embodiment.

FIG. 17 is an exploded perspective view of a lamp including a light source module and a communications module according to at least one example embodiment.

With reference to FIG. 17, a lighting apparatus 1100 may include a socket 1110, a power supply unit 1120, a heat radiating unit 1130, a light source unit 1140, and an optical unit 1170. According to at least one example embodiment of the present inventive concepts, the light source unit 1140 may include a substrate 1142, a plurality of light source modules 1141 mounted on the substrate 1142, and a controller 1143. The controller 1143 may store driving information of the plurality of light source modules 1141 therein.

The lighting apparatus 1100 may include a reflecting plate 1150 disposed above the light source unit 1140, and the reflecting plate 1150 allows light from the light source unit 1140 to be uniformly dispersed toward a lateral surface and a rear, whereby glare may be reduced.

A communications module 1160 may be mounted on an upper part of the reflecting plate 1150, and home-network communications may be implemented through the communications module 1160. For example, the communications module 1160 may be a wireless communications module using Zigbee®, Wi-Fi, or Li-Fi, and may control illumination of a lighting apparatus installed indoors or outdoors, such as on/off operations, brightness adjustment, or the like through a smartphone or a wireless controller. In addition, electronic product systems located indoors or outdoors, such as a TV, a refrigerator, an air conditioner, a door lock, or the like, as well as a vehicle, may be controlled by using a Li-Fi communications module using light having a visible wavelength of a lighting apparatus installed indoors or outdoors.

The reflecting plate 1150 and the communications module 1160 may be covered by an optical unit 1170.

The socket 1110 may be configured to replace an existing lighting apparatus. Electrical power supplied to the lighting apparatus 1100 may be applied through the socket 1110. As illustrated, the power supply unit 1120 may include a first power supply unit 1121 and a second power supply unit 1122 separated from and coupled to each other. The heat radiating unit 1130 may include an internal heat radiating portion 1131 and an external heat radiating portion 1132. The internal heat radiating portion 1131 may be directly connected to the light source unit 1140 and/or the power supply unit 1120, by which heat may be transferred to the external heat radiating portion 1132.

The optical unit 1170 may include an internal optical unit (not shown) and an external optical unit (not shown), and may be configured such that light emitted from the light source unit 1140 may be uniformly dispersed.

A plurality of light source modules 1141 of the light source unit 1140 may receive electrical power from the power supply unit 1120 and then emit light to the optical unit 1170. The light source modules 1141 may include a substrate, a black matrix, and a plurality of semiconductor light emitting devices (see FIG. 1).

Figure 18:
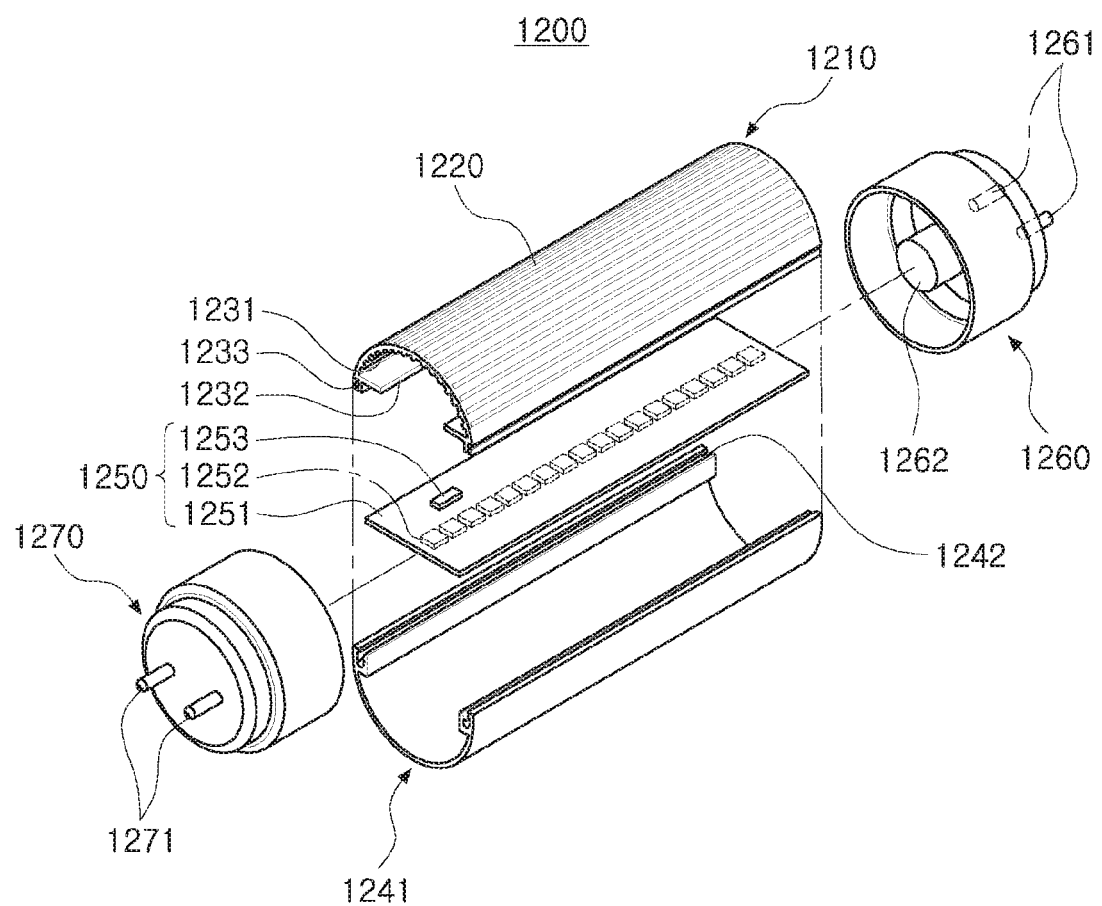
FIG. 18 is an exploded perspective view of a bar type lamp employing a light source module according to at least one example embodiment.

FIG. 18 is an exploded perspective view of a bar type lamp employing a light source module according to at least one example embodiment.

With reference to FIG. 18, a lighting apparatus 1200 may include a heat radiating member 1210, a cover 1241, a light source unit 1250, a first socket 1260, and a second socket 1270.

A plurality of heat radiating fins 1220 and 1231 having a concave-convex form may be formed on an inner surface or/and an external surface of the heat radiating member 1210, and the heat radiating fins 1220 and 1231 may be designed to have various forms and intervals therebetween.

A support portion 1232 having a protruding form may be formed inwardly of the heat radiating member 1210. The light source unit 1250 may be fixed to the support portion 1232. Stoppage protrusions 1233 may be formed on both ends of the heat radiating member 1210.

The cover 1241 may include stoppage grooves 1242 formed therein, and the stoppage grooves 1242 may be coupled to the stoppage protrusions 1233 of the heat radiating member 1210 in a hook coupling structure. Positions in which the stoppage grooves 1242 and the stoppage protrusions 1233 are formed may be changed inversely.

The light source unit 1250 may include a light source module array. The light source unit 1250 may include a printed circuit board 1251, light source modules 1252, and a controller 1253. As described above, the controller 1253 may store driving information of the light source modules 1252 therein. The printed circuit board 1251 may be provided with circuit wirings formed therein, for operating the light source modules 1252. In addition, constituent elements for operating the light source modules 1252 may be included in the light source unit 1250.

The first and second sockets 1260 and 1270 may be provided as a pair of sockets and may have a structure in which they are coupled to opposing ends of a cylindrical cover unit configured of the heat radiating member 1210 and the cover 1241. For example, the first socket 1260 may include electrode terminals 1261 and a power supply device 1262, and the second socket 1270 may include dummy terminals 1271 disposed thereon. In addition, an optical sensor and/or a communications module may be embedded inside one of the first socket 1260 or the second socket 1270. For example, the optical sensor and/or the communications module may be installed within the second socket 1270 in which the dummy terminals 1271 are disposed. As another example, an optical sensor and/or a communications module may be installed within the first socket 1260 in which the electrode terminals 1261 are disposed.

According to at least one example embodiment of the present inventive concepts, an Internet of Things (IoT) device has an accessible wired or wireless interface, may be in communication with one or more other devices through a wired/wireless interface, and may include devices for transmitting or receiving data. The accessible interface may include a wired local area network (LAN), a wireless local area network (WLAN) such as wireless fidelity (Wi-Fi), wireless personal area network (WPAN) such as Bluetooth, wireless universal serial bus (wireless USB), Zigbee®, near field communications (NFC), radio-frequency identification (RFID), power line communications (PLC), a modem communications interface accessible to a mobile communications network (mobile cellular network) such as a 3rd generation (3G) network, a 4th Generation (4G) network, a long term evolution (LTE) network, or the like. The Bluetooth interface may support Bluetooth low energy (BLE).

Figure 19:
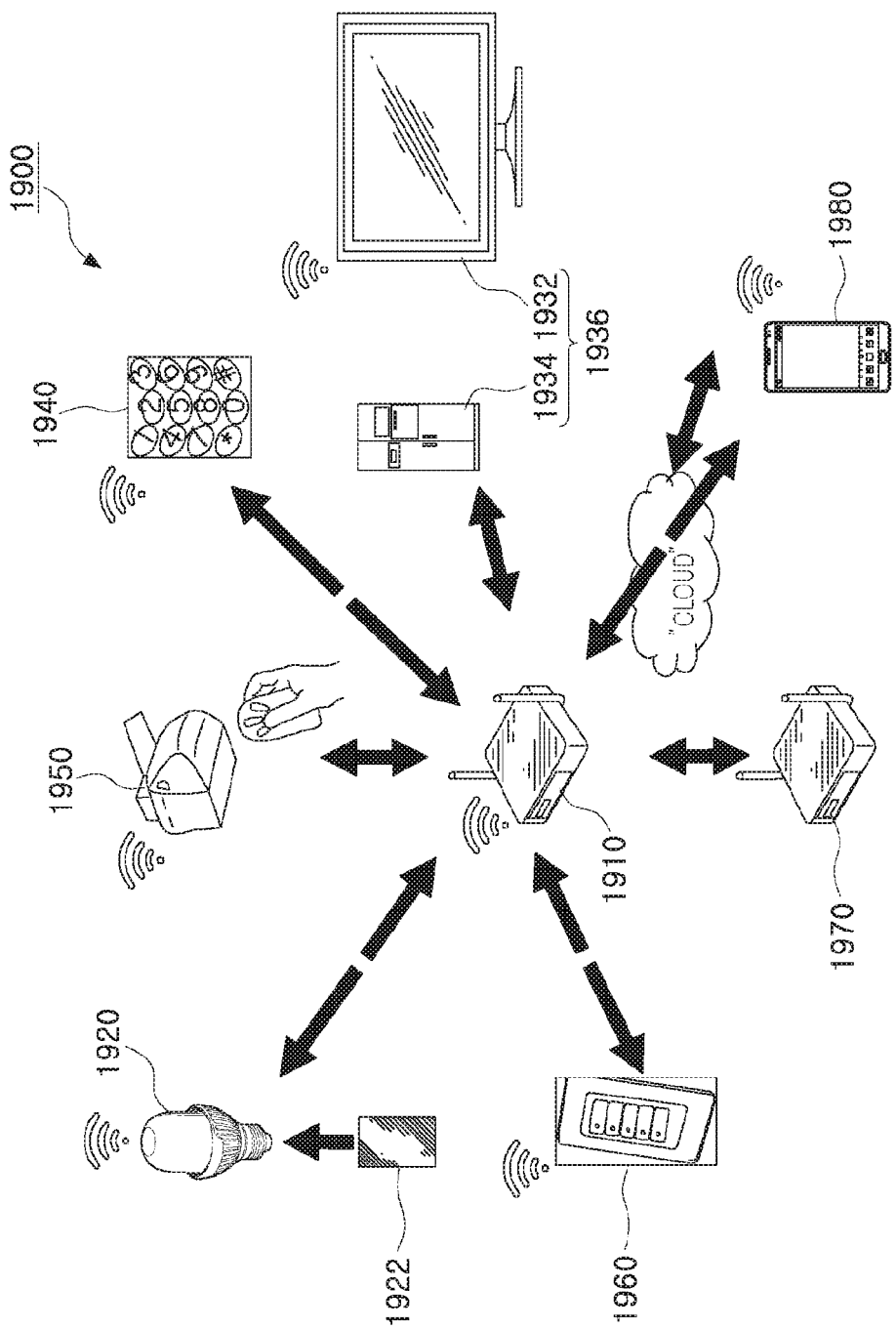
FIG. 19 is an indoor lighting control network system capable of employing a light source module according to at least one example embodiment.

FIG. 19 is an indoor lighting control network system capable of employing a light source module according to at least one example embodiment.

According to at least one example embodiment, a network system 1900 may be a complex smart lighting-network system in which lighting technology using a semiconductor light emitting device such as an LED or the like, Internet of Things (IoT) technology, wireless communications technology, and the like converge with one another. The network system 1900 may be implemented using various lighting apparatuses and a wired and wireless communications device, and implemented by a sensor, a controller, a communications means, software for network control and maintenance, or the like.

The network system 1900 may not only be applied to a closed space defined within a building such as a house or an office, but also to an open space such as a park, a street, or the like. The network system 1900 may be implemented based on an Internet of Things environment so as to collect/process various types of information and to provide the same for a user. In this case, an LED lamp 1920 included in the network system 1900 may serve a role not only in receiving information on surroundings from a gateway 1910 to control lighting of the LED lamp 1920, but also checking and controlling an operational state of other apparatuses 1930 to 1980 included in the Internet of Things environment, based on a function such as visible light communications of the LED lamp 1920 or the like.

With reference to FIG. 19, the network system 1900 may include the gateway 1910 for processing data transmitted and received according to different communications protocols, an LED lamp 1920 connected to the gateway 1910 to enable communications and including an LED as a light source, and a plurality of apparatuses 1930 to 1980 connected to the gateway 1910 to enable communications according to various wireless communications methods. For implementing the network system 1900 based on the Internet of Things environment, respective apparatuses 1930 to 1980 as well as the LED lamp 1920 may include at least one communications module. As at least one example embodiment, the LED lamp 1920 may be connected to the gateway 1910 to enable communications by a wireless communications protocol such as Wi-Fi, Zigbee®, Li-Fi, or the like. To this end, the LED lamp 1920 may include at least one communications module 1922 for a lamp.

As described above, the network system 1900 may not only be applied to a closed space such as a home, an office and the like but also to an open space such as a street or a park. For example, when the network system 1900 is applied to a home, the plurality of apparatuses 1930 to 1980 included in the network system 1900 and connected to the gateway 1910 based on Internet of things technology to enable communications may include a household appliance 1930, a digital door lock 1940, a garage door lock 1950, a switch 1960 for lighting installed on a wall or the like, a router 1970 for repeating a wireless communications network, and a mobile device 1980 such as a smartphone, a tablet PC, a laptop computer, and the like.

In the network system 1900, the LED lamp 1920 may check an operational state of various apparatuses 1930 to 1980 by using a wireless communications network (Zigbee®, Wi-Fi, Li-Fi, or the like) installed in a home, or may automatically control illumination of the LED lamp 1920 itself according to the surrounding environment/situation. In addition, the apparatuses 1930 to 1980 included in the network system 1900 may be controlled by using LED Wi-Fi (Li-Fi) communications using visible light emitted from the LED lamp 1920.

First, the LED lamp 1920 may automatically control illumination of the LED lamp 1920 based on information on a surrounding environment transferred from the gateway 1910 through a communications module 1922 for a lamp, or information on a surrounding environment collected from a sensor mounted on the LED lamp 1920. For example, lighting brightness of the LED lamp 1920 may be automatically controlled according to a type of program broadcast on a television 1932 or brightness of a screen on an appliance 1934. To this end, the LED lamp 1920 may receive information on operations of the television 1932 from the communications module 1922 for a lamp connected to the gateway 1910. The communications module 1922 for a lamp may be modularized to be integrated with a sensor and/or a controller included in the LED lamp 1920.

For example, in a case in which a type of program broadcast on a TV is a drama; according to a preset setting value, a color temperature of lighting may be lowered to be equal to or less than 12,000K, for example, 6,000K, and a color may also be controlled, whereby a cozy atmosphere may be created. In a case in which a program is a comedy program, the network system 1900 may be configured in such a manner that a color temperature of lighting may be increased to 6, 000K or higher according to a lighting intensity setting value and adjusted to be bluish-white lighting.

In addition, when a desired (and/or alternatively predetermined) period of time has elapsed after a digital door lock 1940 has been locked in a state of absence of people from a house, all turned-on LED lamps 1920 may be turned-off, whereby electricity wastage may be reduced and/or prevented. In addition, in a case in which a security mode is set through the mobile device 2800 or the like, when the digital door lock 1940 is locked in a state of absence of people in a house, a turn-on state of the LED lamps 1920 may be maintained.

Operations of the LED lamp 1920 may be controlled according to a surrounding environment collected through various sensors connected to the network system 1900. For example, when the network system 1900 is implemented inside a building, lighting, a position sensor, and a communications module are coupled inside the building, and location information of people inside the building is collected to turn on or off lighting, or collected information may be provided in real time. Therefore, facility management, the use of idle space, or the like may be efficiently carried out. A lighting apparatus such as the LED lamp 1920 is generally disposed in almost all of the spaces of a building on respective floors thereof, whereby various types of information inside the building may be collected through a sensor provided integrally with the LED lamp 1920, which may be used for facility management, using idle space, or the like.

Meanwhile, the LED lamp 1920 may be coupled to an image sensor, a storage device, a communications module 1922 for a lamp, and the like, and thus, may be used as an apparatus capable of maintaining building security or detecting and reacting to an emergency situation. For example, when a smoke or temperature detecting sensor or the like is attached to the LED lamp 1920, an outbreak of fire or the like may be quickly detected, whereby damage may be significantly reduced. In addition, in consideration of weather, degree of sunlight, or the like, brightness of lighting may be adjusted, thereby providing energy saving and a pleasant lighting environment.

Figure 20:
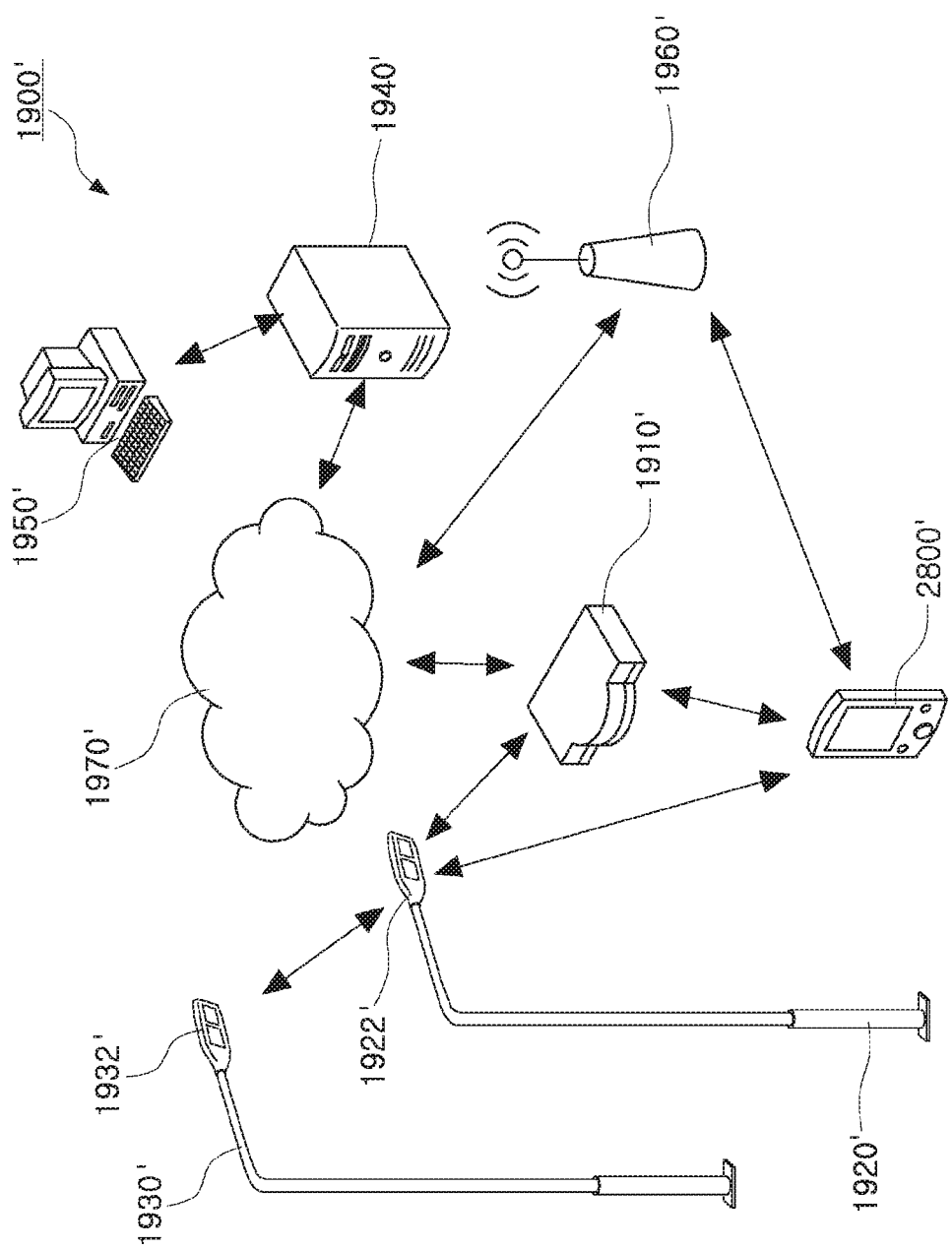
FIG. 20 is an open type network system capable of employing a light source module according to at least one example embodiment.

FIG. 20 is an open type network system capable of employing a light source module according to at least one example embodiment.

With reference to FIG. 20, the network system 1900' according to at least one example embodiment may include a communications connection device 1910', a plurality of lighting fixtures 1920' and 1930' installed at desired (and/or alternatively predetermined) intervals to be connected to the communications connection device 1910' to communicate therewith, a server 1940', a computer 1950' for managing the server 1940', a communications base station 1960', a communications network 1970' connecting the communications available devices to one another, a mobile device 1980', and the like.

A plurality of lighting fixtures 1920' and 1930' installed in an open outdoor space such as a street or a park or the like may include smart engines 1922' and 1932', respectively. The smart engines 1922' and 1932' may include a semiconductor light emitting device emitting light, a sensor collecting information on a surrounding environment in addition to a driver for driving the semiconductor light emitting device, a communications module, and the like. The smart engines 1922' and 1932' may communicate with other peripheral equipment according to a communications protocol such as Wi-Fi, Zigbee®, Li-Fi, or the like by the communications module.

In one example, one smart engine 1922' may be connected to another smart engine 1932' to communicate therewith. In this case, Wi-Fi expansion technology (Wi-Fi Mesh) may be applied to communications between the smart engines 1922' and 1932'. At least one smart engine 1922' may be connected to the communications connection device 1910' connected to the communications network 1970' by wired/wireless communications. To improve the efficiency of communications, several smart engines 1922' and 1932' may be grouped and then connected to a single communications connecting device 1910'.

The communications connection device 1910' may be an access point (AP) to enable wired/wireless communications, and may communicate between the communications network 1970' and other devices. The communications connection device 1910' may be connected to the communications network 1970' by at least one of wired/wireless manners. For example, the communications connection device 1910' may be mechanically accommodated inside either of the lighting fixtures 1920' and 1930'.

The communications connection device 1910' may be connected to the mobile device 1980' through a communications protocol such as Wi-Fi or the like. A user of the mobile device 1980' may receive information on a surrounding environment collected by a plurality of the smart engines 1922' and 1932' through the communications connection device 1910' connected to the smart engine 1922' of the surrounding lighting fixture 1920' adjacent to the user of the mobile device 1980'. The information on a surrounding environment may include surrounding traffic information, weather information, and the like. The mobile device 1980' may be connected to the communications network 1970' in a wireless cellular communications manner such as 3G, 4G, or the like through the communications base station 1960'.

On the other hand, the server 1940' connected to the communications network 1970' may receive information collected by the smart engines 1922' and 1932' mounted on the lighting fixtures 1920' and 1930', respectively, and may monitor an operational state and the like of the respective lighting fixtures 1920' and 1930' at the same time. The server 1940' may be connected to the computer 1950' to manage the respective lighting fixtures 1920' and 1930' based on a result of monitoring an operational state of the respective lighting fixtures 1920' and 1930'. The computer 1950' may execute software or the like capable of monitoring and managing an operational state of the respective lighting fixtures 1920' and 1930' and the smart engines 1922' and 1932'.

Figure 21:
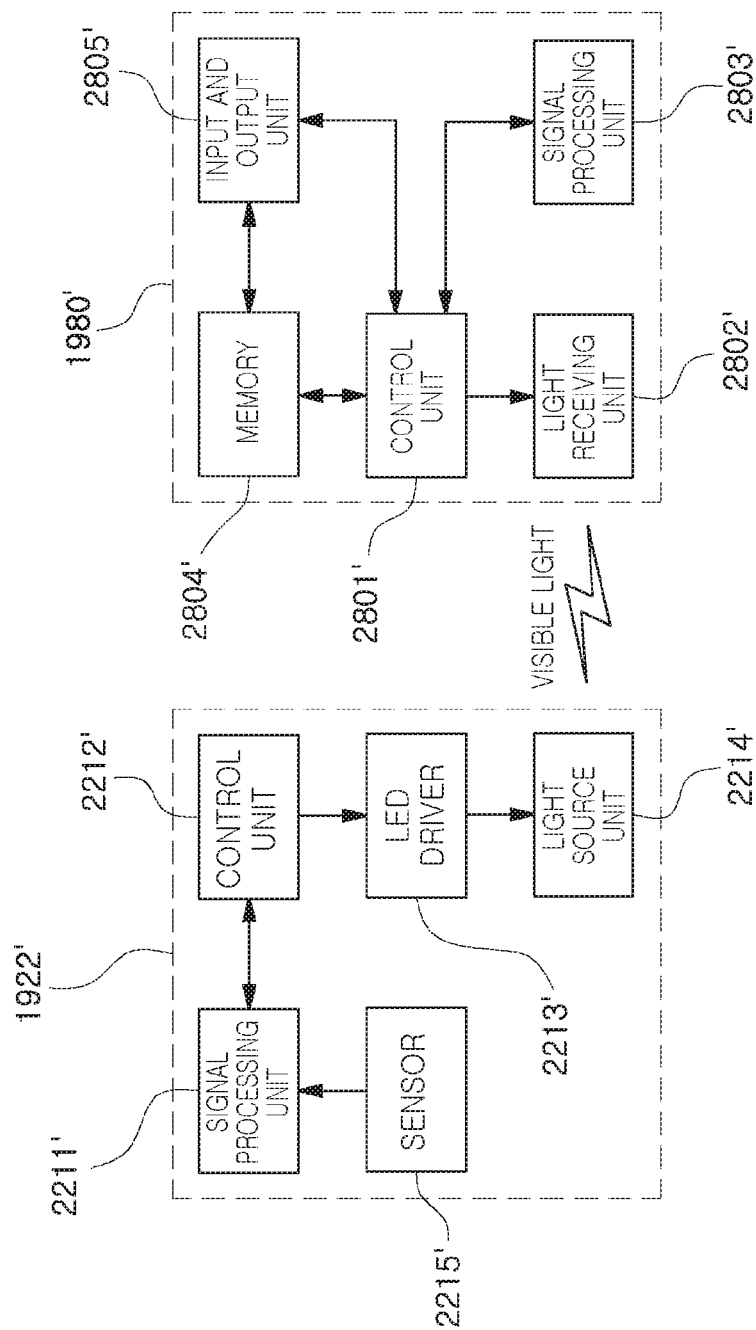
FIG. 21 is a block diagram illustrating communications operations of a smart engine and a mobile device of a lighting fixture by visible light wireless communications according to at least one example embodiment.

FIG. 21 is a block diagram illustrating communications operations of a smart engine and a mobile device of a lighting fixture by visible light wireless communications according to at least one example embodiment.

With reference to FIG. 21, a smart engine 1922' may include a signal processing unit 2211', a control unit 2212', an LED driver 2213', a light source unit 2214', a sensor 2215', and the like. A mobile device 1980' connected to the smart engine 1922' by the visible light wireless communications may include a control unit 2801', a light receiving unit 2802', a signal processing unit 2803', a memory 2804', an input and output unit 2805', and the like.

Visible light wireless communications (Li-Fi) technology is wireless communications technology capable of wirelessly transferring information using light in a visible light wavelength band, which is light perceptible to the human eye. The visible light wireless communications technology may be distinguished from the existing wired optical communications technology and infrared light wireless communications in the way that light in a visible light wavelength band, in other words, a specific visible light frequency from a light emitting package described in at least one example embodiment, is used, and may be distinguished from wired optical communications technology in the way that a communications environment is wireless. In addition, visible light wireless communications technology has, unlike RF wireless communications, convenience in being able to be freely used without restriction or authorization in terms of frequency use, excellent physical security, and differentiation for allowing a user to visually confirm a communications link. Further, the visible light wireless communications technology has features of convergence technology capable of obtaining a unique purpose of a light source and a communications function at the same time.

The signal processing unit 2211' of the smart engine 1922' may process data to be transmitted and received by visible light wireless communications. As at least one example embodiment, the signal processing unit 2211' may process information collected by the sensor 2215' as data and may transmit the processed information to the control unit 2212'. The control unit 2212' may control operations of the signal processing unit 2211', the LED driver 2213', and the like, and may also control operations of the LED driver 2213' based on the data transmitted by the signal processing unit 2211'. The LED driver 2213' may allow the light source unit 2214' to emit light in response to a control signal transferred by the control unit 2212', such that data may be transferred to the mobile device 1980'.

The mobile device 1980' may include a control unit 2801', a memory 2804' storing data therein, a display device and a touch screen, an input and output unit 2805' including an audio output unit and the like, a signal processing unit 2803', and a light receiving unit 2802' detecting visible light including data signals. The light receiving unit 2802' may detect and convert visible light into an electronic signal, and the signal processing unit 2803' may decode data included in the electronic signal converted by the light receiving unit. The control unit 2801' may store the data decoded by the signal processing unit 2803' in the memory 2804', or may output the data to allow a user to recognize the output data through the input and output unit 2805' or the like.

As set forth above, according to example embodiments of the present inventive concepts, a light source module capable of precisely and quickly moving a chip through a vacuum chuck, and a display apparatus including the same may be provided.

Figure 22:
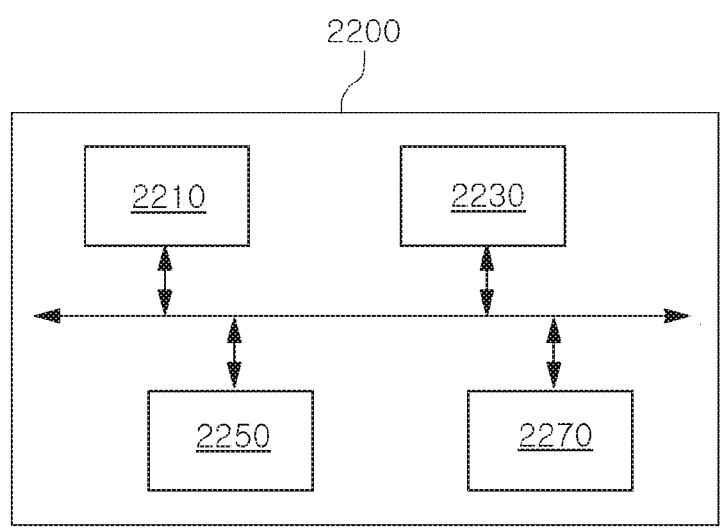
FIG. 22 is a block diagram illustrating a controller device, according to at least one example embodiment.

FIG. 22 is a block diagram illustrating a controller device 2200, according to at least one example embodiment. A controller device 2200 may include a computer processing device. Referring to FIG. 22, a controller device 2200 may include a processing device ("processor") 2210, a memory 2230, an input-output device 2250, and a storage device 2270. In some example embodiments, the controller device 2200 may include a computing system configured to carry out various programs. Such programs may include computer-executable program instructions to control the vacuum clamp V to removably couple and/or decouple semiconductor light emitting devices from connection pads, through removable insertion through a hole, as described above. Such programs may include computer-executable program instructions to control the sensor device 2300 to monitor for defective semiconductor light emitting devices, as described above.

The processing device 2210 (also referred to as a "processor") may be configured to run a variety of instances of software, such as application programs, operating systems, and device drivers. For example, the processing device 2210 may be configured to run an operating system (not shown) loaded on the working memory 2230. Further, the processing device 2210 may be configured to run various application programs on the operating system. For example, the processing device 2210 may be configured to control the vacuum clamp V, a sensor device 2300, some combination thereof, or the like, as described above.

The operating system or application programs may be loaded on the working memory 2230. For example, when the computer system starts a booting operation, an OS image (not shown) stored in the storage device 2270 may be loaded on the working memory 2230 according to a booting sequence. In the controller device 2200, overall input/output operations may be managed by the operating system. Similarly, some application programs ("computer-executable programs of instruction") may be loaded on the working memory 2230.

The working memory (also referred to as a "memory") 2230 may be one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

The input-output device 2250 may be configured to control user input and output operations of user interface devices. For example, the input-output device 2250 may include a keyboard or a monitor, allowing an operator to input relevant information, instructions, some combination thereof, or the like.

The storage device (also referred to as a "memory") 2270 may serve as a non-transitory storage medium for the controller device 2200. The storage device 2270 may be configured to store application programs, an OS image, and various data. The storage device 2270 may be provided in the form of one of memory cards (e.g., MMC, eMMC, SD, MicroSD, and so forth) or a hard disk drive (HDD). The storage device 2270 may include a NAND FLASH memory device with a large memory capacity. The storage device 2270 may include at least one of next-generation nonvolatile memory devices (e.g., PRAM, MRAM, ReRAM, or FRAM) or NOR FLASH memory devices.

A system interconnector 2290 may be provided to serve as a system bus for realizing a network in the controller device 2200. The processor device 2210, the working memory 2230, the input-output device 2250, and the storage device 2270 may be electrically connected to each other through the system interconnector 2290, and thus, data may be exchanged therebetween. However, the system interconnector 2290 may not be limited to the afore-described configuration; for example, it may further include an additional element for increasing efficiency in data communication.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A light source module, comprising:
   a substrate including a plurality of chip mounting areas, each chip mounting area including a connection pad;
   a black matrix on the substrate, the black matrix including a plurality of holes, the plurality of holes being in a pattern of holes, the pattern of holes corresponding to a pattern of the chip mounting areas on the substrate; and
   a plurality of semiconductor light emitting devices in separate, respective holes of the plurality of holes, such that the semiconductor light emitting devices are electrically coupled to separate connection pads of separate, respective chip mounting areas corresponding to the separate, respective holes,
   wherein each of the plurality of semiconductor light emitting devices includes,
   a light emitting diode (LED) chip, the LED chip including an electrode pad on one side of the LED chip, and
   a light guide unit with a first surface in contact with an opposite side of the LED chip, the light guide unit being configured to emit light generated by the LED chip into an exterior environment,
wherein the light guide unit includes a rod-shaped structure, and the rod-shaped structure is configured to extend in a longitudinal direction that is substantially perpendicular to the opposite side of the LED chip,
wherein each of the light emitting devices are configured to be clamped to a vacuum chuck and inserted into one hole of the plurality of holes to be tested to determine if the each of the light emitting devices is defective, and
wherein each of the light emitting devices are configured to be selectively removed in response to being determined to be defective.

2. The light source module of claim 1, wherein,
a top surface of the black matrix is below a top surface of each of the semiconductor light emitting devices, such that the plurality of semiconductor light emitting devices protrude from the black matrix.

3. The light source module of claim 1, wherein the light guide unit includes,
a second surface opposing the first surface, and
a third surface between the first surface and the second surface, wherein the third surface couples the first surface and the second surface.

4. The light source module of claim 3, wherein,
the first surface defines a light incident surface configured to receive light emitted by the LED chip into the light guide unit, and
the second surface and the third surface define a light emission surface configured to emit light inside the light guide unit to the exterior environment.

5. The light source module of claim 3, wherein the second surface includes one of,
a planar structure,
a structure recessed toward the first surface,
a concave and convex structure, or
a dome-shaped protruding structure.

6. The light source module of claim 1, wherein,
the LED chip includes,
a first conductivity type semiconductor layer,
a second conductivity type semiconductor layer, and
an active layer between the first and second conductivity type semiconductor layers, and
the electrode pad includes,
a first pad connected to the first conductivity type semiconductor layer, and
a second pad connected to the second conductivity type semiconductor layer.

7. The light source module of claim 1, further including,
a wavelength conversion layer covering each of the plurality of semiconductor light emitting devices on the black matrix.

8. The light source module of claim 1, wherein,
the pattern of holes extends in a transverse direction and the longitudinal direction.

9. The light source module of claim 1, wherein a lateral surface of the substrate is substantially coplanar with a lateral surface of the black matrix.

10. The light source module of claim 1, wherein a thickness of the black matrix is greater than a thickness of the LED chip, and the thickness of the black matrix is less than a sum of thicknesses of the LED chip and the light guide unit.

11. A display apparatus, comprising:
a light source module, the light source module including,
a substrate,
a black matrix covering the substrate, the black matrix including a plurality of holes, and
a plurality of semiconductor light emitting devices detachably located in separate, respective holes of the plurality of holes;
a cover layer covering the black matrix and the plurality of semiconductor light emitting devices; and
a housing at least partially enclosing the light source module
wherein each of the plurality of semiconductor light emitting devices includes,
a light emitting diode (LED) chip, the LED chip including an electrode pad on one side of the LED chip, and
a light guide unit with a first surface in contact with an opposite side of the LED chip, the light guide unit being configured to emit light generated by the LED chip into an exterior environment,
wherein the light guide unit includes a rod-shaped structure, and the rod-shaped structure is configured to extend in a longitudinal direction that is substantially perpendicular to the opposite side of the LED chip,
wherein each of the light emitting devices are configured to be clamped to a vacuum chuck and inserted into one hole of the plurality of holes to be tested to determine if the each of the light emitting devices is defective, and
wherein each of the light emitting devices are configured to be selectively removed in response to being determined to be defective.

12. The display apparatus of claim 11, wherein,
the plurality of semiconductor light emitting devices include a set of adjacent semiconductor light emitting devices, the set of adjacent light emitting devices being a unit pixel.

13. The display apparatus of claim 11, wherein,
one or more portions of the plurality of semiconductor light emitting devices in the plurality of holes protrude from the black matrix, and
the one or more portions of the plurality of semiconductor light emitting devices are embedded inside the cover layer.

14. The display apparatus of claim 11, wherein,
one or more portions of the plurality of semiconductor light emitting devices protrude upwardly from the black matrix while being disposed in the plurality of holes, respectively, protrudes upwardly from the black matrix, and
each semiconductor light emitting device of the plurality of semiconductor light emitting devices includes a wavelength conversion layer, the wavelength conversion layer being configured to cover the one or more portions of each semiconductor light emitting device protruding from the black matrix.

15. The display apparatus of claim 11, further comprising:
a polarizing filter layer configured to cover the cover layer.

16. The display apparatus of claim 11, further comprising:
a driving unit configured to drive the plurality of semiconductor light emitting devices.

17. A controller device, comprising:
a memory storing computer-readable instructions; and
a processor configured to execute the computer-readable instructions to,
form a black matrix on a substrate, the black matrix including a plurality of holes, the plurality of holes being in a pattern of holes, the pattern of holes corresponding to a pattern of connection pads on the substrate; and insert a plurality of semiconductor light emitting devices in separate, respective holes of the plurality of holes, such that the semiconductor light emitting devices are electrically coupled to separate connection pads corresponding to the separate, respective holes, wherein each of the light emitting devices are configured to be clamped to a vacuum chuck and inserted into one of the plurality of holes to be tested to determine if the each of the light emitting devices is defective, and wherein each of the light emitting devices are configured to be selectively removed in response to being determined to be defective.

18. The controller device of claim 17, wherein the processor is further configured to execute computer-readable instructions to, remove a particular semiconductor light emitting device from a corresponding hole of the plurality of holes, based on a determination that the semiconductor light emitting device emits less than a threshold amount of light concurrently with at least a threshold amount of electrical power being supplied to the semiconductor light emitting device through a connection pad to which the semiconductor light emitting device is electrically coupled.

19. The controller device of claim 18, wherein the processor is further configured to execute computer-readable instructions to, control a supply of electrical power to the semiconductor light emitting device, such that at least the threshold amount of electrical power is supplied to the semiconductor light emitting device through the connection pad to which the semiconductor light emitting device is electrically coupled; and control a sensor device to generate sensor data indicating an amount of light emitted by the semiconductor light emitting device, concurrently with the controlling the supply of electrical power; and processing the sensor data to determine whether the semiconductor light emitting device emits at least the threshold amount of light concurrently with being supplied at least the threshold amount of electrical power.

20. The controller device of claim 17, wherein the processor is further configured to execute computer-readable instructions to, insert the plurality of semiconductor light emitting devices in separate, respective holes of the plurality of holes according to a particular pattern of semiconductor light emitting devices.

* * * * *